US006998284B2

(12) United States Patent
Kyono et al.

(10) Patent No.: US 6,998,284 B2
(45) Date of Patent: Feb. 14, 2006

(54) SEMICONDUCTOR DEVICE HAVING QUANTUM WELL STRUCTURE, AND METHOD OF FORMING THE SAME

(75) Inventors: Takashi Kyono, Itami (JP); Masaki Ueno, Itami (JP); Katsushi Akita, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/057,830

(22) Filed: Feb. 15, 2005

(65) Prior Publication Data

US 2005/0199903 A1   Sep. 15, 2005

(30) Foreign Application Priority Data

Feb. 17, 2004  (JP)  ............ P2004-040434
Aug. 11, 2004  (JP)  ............ P2004-234811

(51) Int. Cl.
 *H01L 21/00*  (2006.01)
(52) U.S. Cl. ............... 438/46; 257/13; 257/90
(58) Field of Classification Search ............... 438/22, 438/28, 46, 47, 956; 257/13, 14, 90
See application file for complete search history.

(56) References Cited

U.S. PATENT DOCUMENTS 6,738,175 B2 *  5/2004  Morita et al. ............... 359/248

FOREIGN PATENT DOCUMENTS

| JP | 06-268257 | 9/1994 |
| JP | 10-084132 | 3/1998 |
| JP | 2001-168471 A | 6/2001 |
| JP | 2002-043618 A | 2/2002 |

* cited by examiner

*Primary Examiner*—David Nelms
*Assistant Examiner*—Quoc Hoang
(74) *Attorney, Agent, or Firm*—McDermott Will & Emery LLP

(57) ABSTRACT

A method of forming a semiconductor device having a quantum well structure, comprises the steps of: (a) forming a well film at a first temperature, the well film being made of a III-V nitride semiconductor containing nitrogen, indium and gallium; (b) forming a first barrier film on the well film, the first barrier film being made of a III-V nitride semiconductor containing nitrogen, indium and gallium, and an indium composition of the first barrier film being smaller than that of the well film; (c) changing temperature without forming a semiconductor film; and (d) forming a second barrier film at a second temperature higher than the first temperature, the second barrier film being made of a III-V nitride semiconductor on the first barrier film, the first barrier film being formed at a third temperature, the third temperature being equal to or higher than the first temperature, and the third temperature being lower than the second temperature.

23 Claims, 17 Drawing Sheets

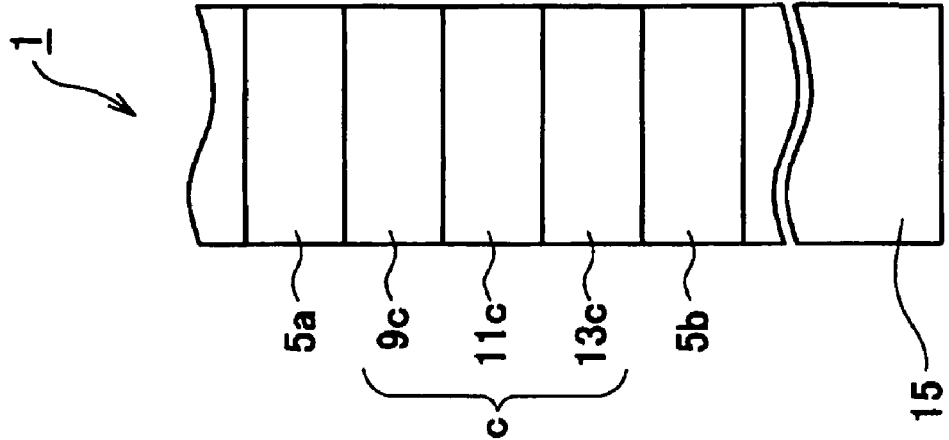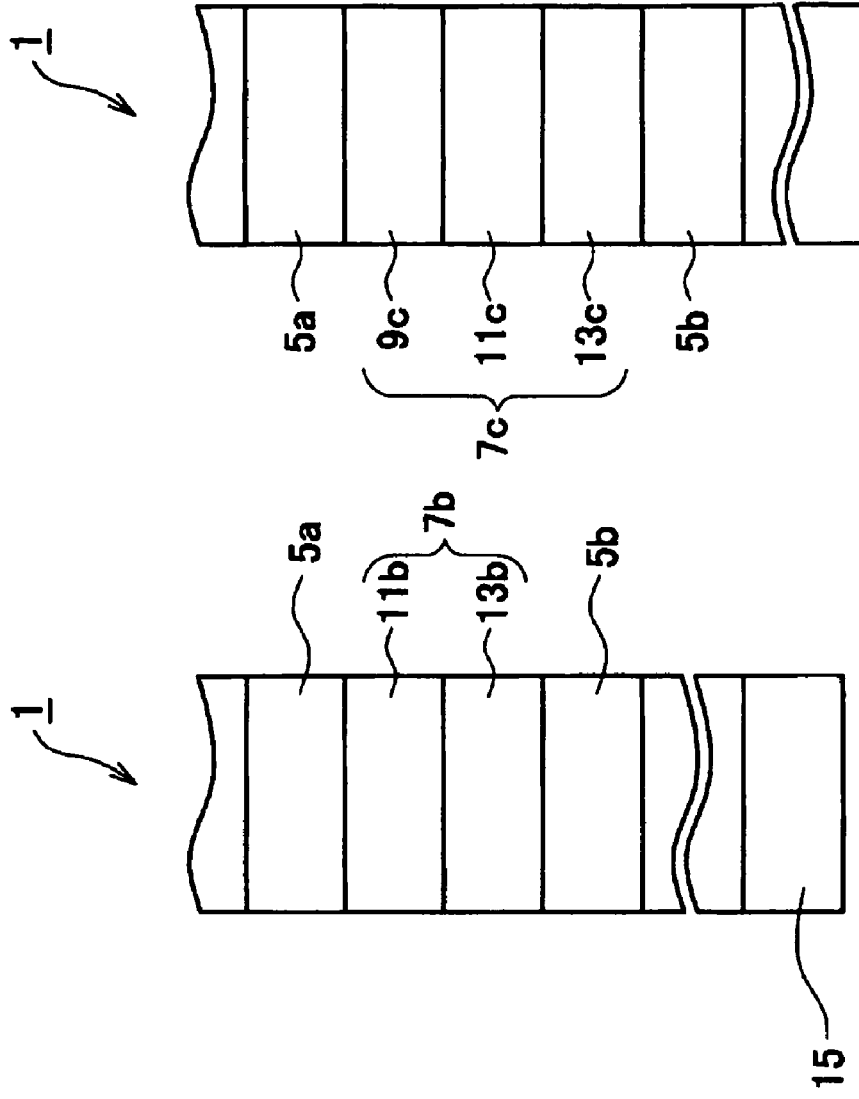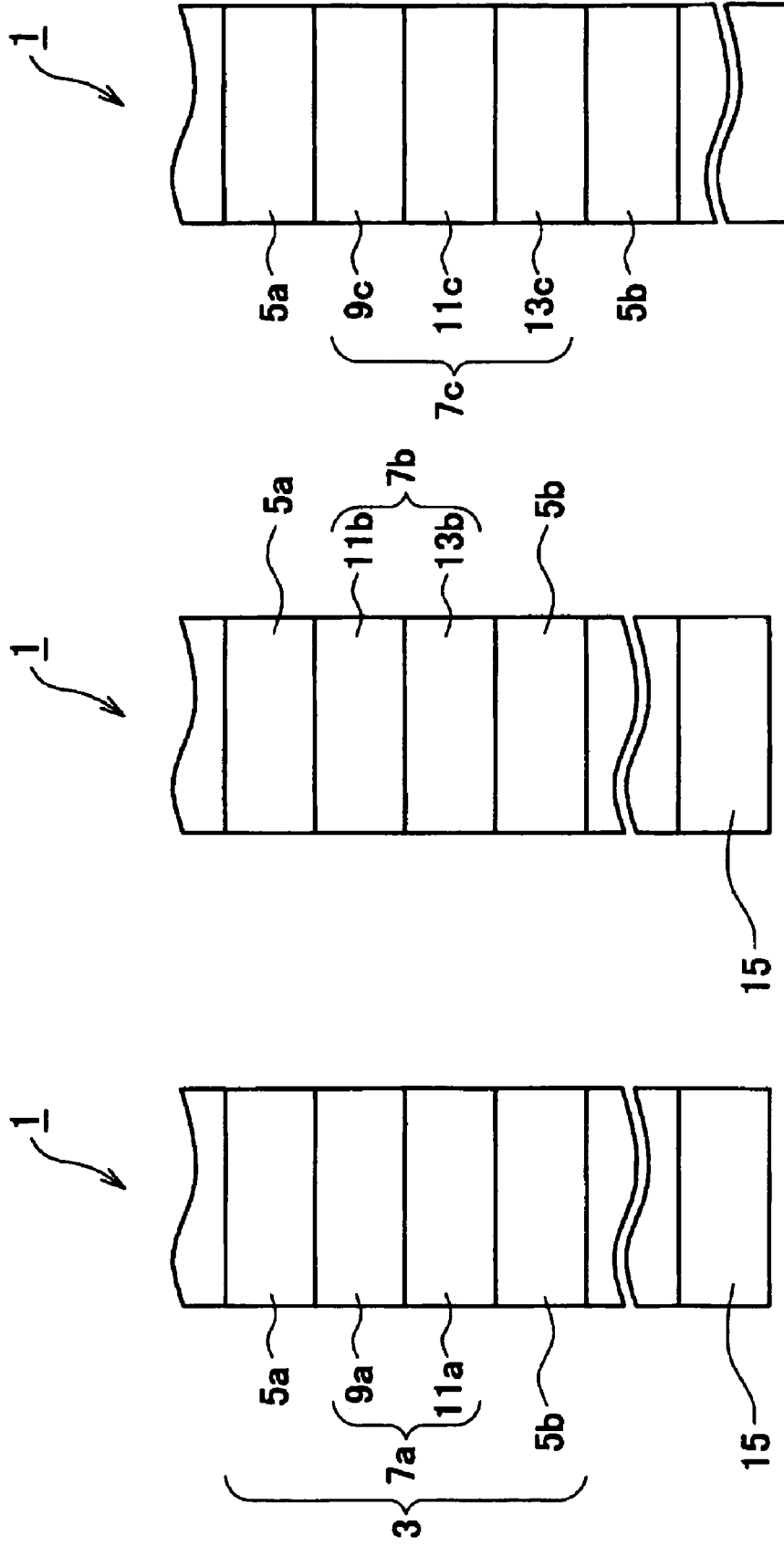

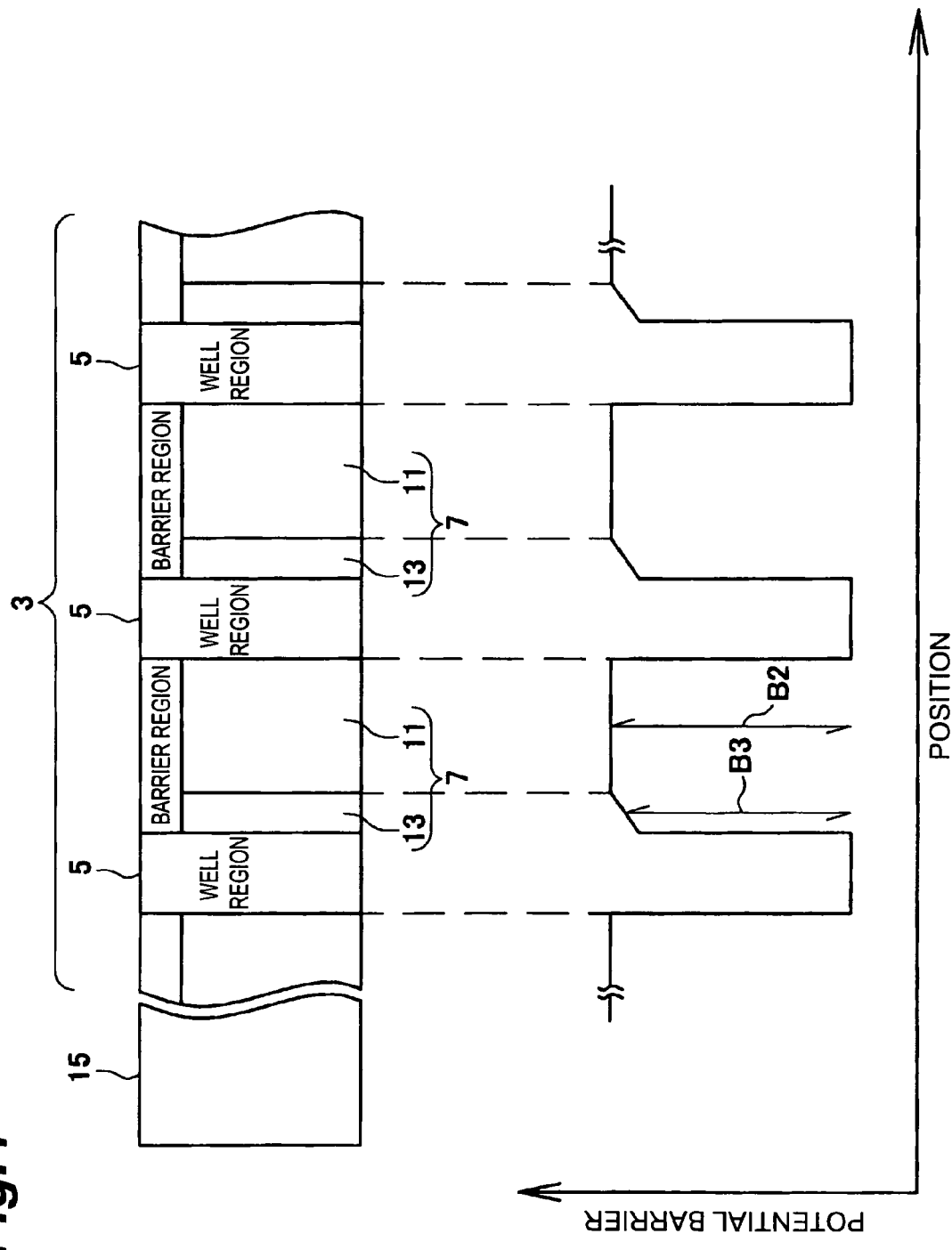

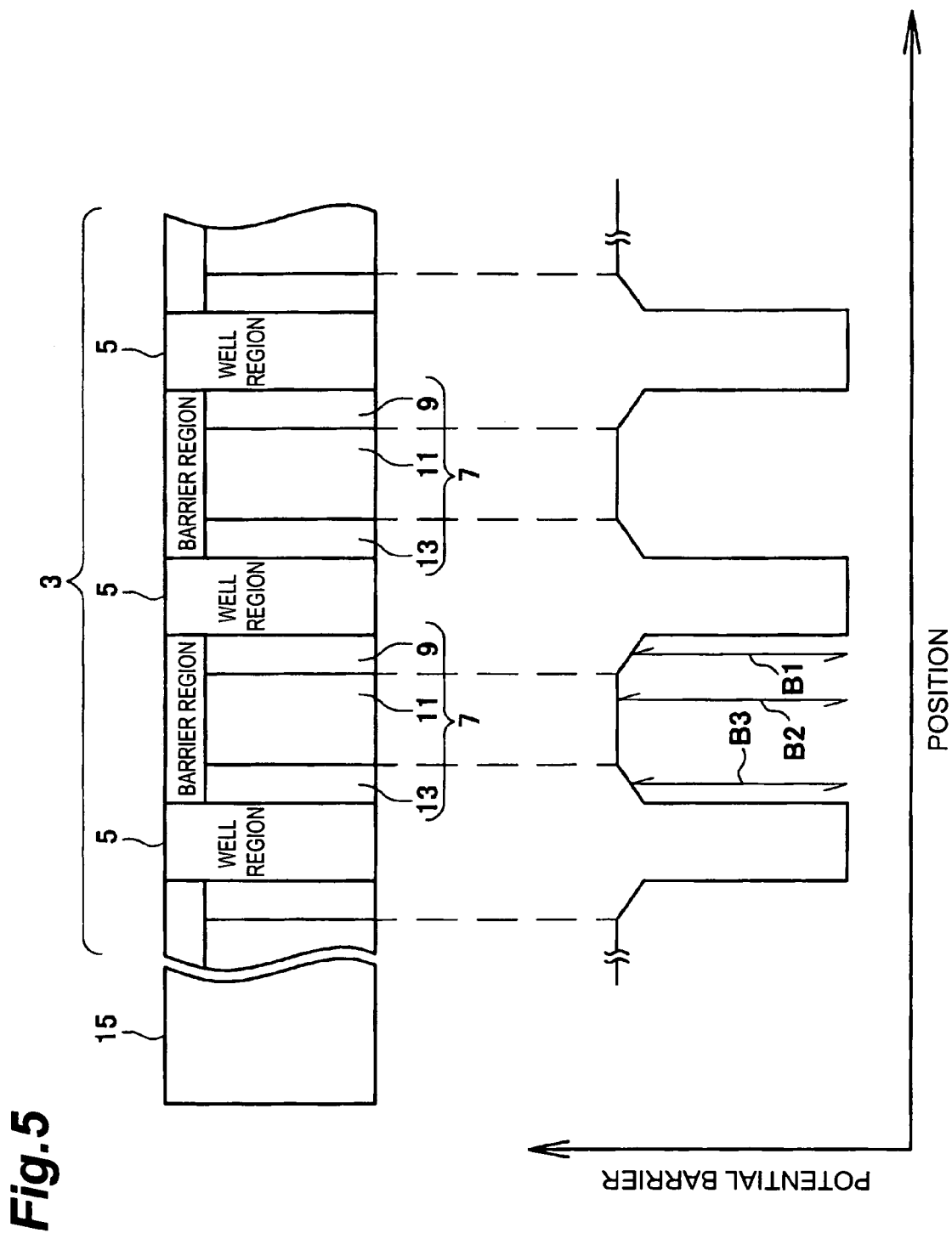

SEMICONDUCTOR DEVICE HAVING QUANTUM WELL STRUCTURE, AND METHOD OF FORMING THE SAME

BACKGROUND OF THE INVENTION

Field of the Invention
Related Background Art
The present invention relates to a semiconductor device having a quantum well structure and to a method of forming the same.

BACKGROUND ART

Document 1 (Japanese Patent Application Laid-Open No. 2001-168471) discloses a nitride semiconductor laser diode having a active layer with the quantum well structure. In the nitride semiconductor laser diode, the active layer has intermediate layers each of which is provided between one of well layers and one of barrier layers in the active layer. The intermediate layers are made of $Al_dGa_{1-d}N$ ($0.30 \leq d \leq 1$) and the bandgap energy of the intermediate layers is greater than that of the barrier layers. The addition of the intermediate layers can decrease the threshold voltage and driving voltage of the nitride semiconductor laser diode. This nitride semiconductor laser diode improves the luminous efficiency thereof by use of the AlGaN intermediate layers, which has a bandgap energy larger than that of the barrier layers, between the well layers and the barrier layers of nitride semiconductors containing indium.

Document 2 (Japanese Patent Application Laid-Open No. 10-84132) discloses semiconductor light emitting devices such as a semiconductor laser and a light emitting diode. The semiconductor light emitting devices have a light generating region with a superlattice structure. This light generating layer includes quantum well layers, barrier layers and buffer layers. Each buffer layer is located between one of the quantum well layers and one of the barrier layers. Potential barrier between the quantum well layers and the buffer layers is smaller than potential barrier between the quantum well layers and the barrier layers without the buffer layers. The buffer layers are formed so as not to work as a substantial barrier layer. Since the lattice constant of the buffer layers is between that of the quantum well layers and that of the barrier layers, the buffer layers alleviate stress from the difference between the lattice constants of the barrier layers and the quantum well layers. In these semiconductor light emitting devices, the quantum well layers are made of $In_XGa_{1-X}N$ ($0<X$) and the buffer layers are made of $In_YGa_{1-Y}N$ ($0<Y<X$). Since potential barrier between the quantum well layers and the barriers layer become smaller if semiconductor material of the barrier layers contains indium, the barrier layers are made of GaN.

Document 3 (Japanese Patent Application Laid-Open No. 6-268257) discloses a GaN-based compound semiconductor light emitting device. This GaN-based compound semiconductor light emitting device has a multilayer light generating region between an n-type GaN-based compound semiconductor layer and a p-type GaN-based compound semiconductor layer. The multilayer light generating region is constituted by $In_XGa_{1-X}N$ ($0<X<1$) layers with different X values from each other, which are alternately arranged. Thickness of the $In_XGa_{1-X}N$ layers in the multilayer light generating region falls within the range of 0.5 nanometers to 5 nanometers. The multilayer light generating region improves the emission output of the GaN-based compound semiconductor light emitting device.

Document 4 (Japanese Patent Application Laid-Open No. 2002-43618) discloses a method of forming a nitride semiconductor, which has a step of growing a well layer at the temperature of 750 degrees Celsius, and a step of growing a barrier layer after the well layer has been formed. In this method, the barrier layer is formed of a first semiconductor film and a second semiconductor film. The first barrier semiconductor film is grown with increase of temperature, and the second semiconductor film is grown at a fixed temperature immediately after the first semiconductor layer has been grown.

SUMMARY OF THE INVENTION

In the semiconductor light emitting device disclosed in Document 1, the semiconductor layer referred to as the intermediate layers is formed of AlGaN semiconductor the bandgap of which is larger than that of the barrier layers. After this AlGaN semiconductor layer (intermediate layer) has been formed on an InGaN semiconductor layer (well layer), the temperature is raised to a temperature for growing the barrier layer and indium atoms are decomposed from the well layer during this raising. This decomposition makes it difficult to form abrupt junctions in the quantum well structure.

In the semiconductor light emitting device disclosed in Document 2, the semiconductor layer referred to as the buffer layers is grown so as not to work as a substantial barrier layer. Since the lattice constant of the buffer layers is between that of the quantum well layers and that of the barrier layers, the buffer layers alleviate stress from the difference between the lattice constants of the barrier layer and the quantum well layer. But, a relatively large potential barrier is formed at respective interfaces in the following arrangements: between the quantum well layers and the buffer layers; between the buffer layers and the barrier layers. The quantum well structure increases the number of interfaces exhibiting the relatively large potential barrier because of the following: the lattice constant of the buffer layers is selected around the midpoint between that of the barrier layers and that of the well layer; the buffer layers and the well layer therebetween are inevitably located between the barrier layers.

In the semiconductor light emitting device disclosed in Document 3, the light generating region is formed by repetitively growing the InGaN layers of different compositions at 800 degrees Celsius. With increase of the number of growth of the InGaN layers, flatness of the surfaces of the InGaN layers is degraded growth by growth and thus it is difficult to form abrupt junctions between the InGaN layers. What is needed in single or multiple quantum well structures is abrupt junctions between well layers and barrier layers therein.

It is an object of the present invention to provide a semiconductor device providing an abrupt junction in the quantum well structure, and a method of forming the semiconductor device.

One aspect of the present invention relates to a method of forming a semiconductor device having a quantum well structure. The method comprises the steps of: forming a well film at a first temperature, the well film being made of a III-V nitride semiconductor containing nitrogen, indium and gallium; forming a first barrier film on the well film, the first barrier film being made of a III-V nitride semiconductor containing nitrogen, indium and gallium, and an indium composition of the first barrier film being smaller than that of the well film; after forming the first barrier film, changing temperature without depositing a semiconductor film; and after changing the temperature, forming a second barrier film at a second temperature higher than the first temperature, the second barrier film being made of a III-V nitride semiconductor on the first barrier film, the first barrier film being formed at a third temperature, the third temperature being equal to or higher than the first temperature, and the third temperature being lower than the second temperature.

In the step of forming the first barrier film on the well film according to the present invention, at least a portion of the first barrier film is grown while changing a growth temperature.

In the method according to the present invention, the step of forming the first barrier film on the well film is carried out in a succession of the step of forming the well film at the first temperature.

In the method according to the present invention, the first barrier film is made of an $In_{X1}Ga_{1-X1}N$ semiconductor, where X1 is more than zero and less than one. The second barrier film is made of an $In_{X2}Ga_{1-X2}N$ semiconductor, where X2 is not less than zero and is less than one, and the well film is made of an $In_{X3}Ga_{1-X3}N$ semiconductor, where X3 is more than zero and less than one, and X3 is larger than X1.

Another aspect of the present invention relates to a method of forming a semiconductor device having a quantum well structure. The method comprises the steps of: forming a well film at a first temperature, the well film being made of a III-V nitride semiconductor containing nitrogen, indium and gallium; forming a first barrier film on the well film, the first barrier film being made of a III-V nitride semiconductor containing nitrogen, indium, and gallium, an indium composition of the first barrier film being smaller than an indium composition of the well film; after forming the first barrier film, rising a temperature without depositing a semiconductor film; and forming a second barrier film on the first barrier film at a second temperature, the second barrier film being made of a III-V nitride semiconductor, at least a portion of the first barrier film being formed during a temperature rise from the first temperature to a third temperature, the temperature in the step of rising a temperature being increased from the third temperature to the second temperature in a predetermined period of time, and a period of time for the temperature rise from the first temperature to the third temperature being shorter than the predetermined period of time.

In the method according to the present invention, the predetermined period is not less than 1 minute nor more than 5 minutes.

In the method according to the present invention, the step of forming the first barrier film on the well film is carried out in a succession of the step of forming the well film at the first temperature.

In the method according to the present invention, the first barrier film is made of an $In_{X1}Ga_{1-X1}N$ semiconductor, where X1 is more than zero and less than one. The second barrier film is made of an $In_{X2}Ga_{1-X2}N$ semiconductor, where X2 is not less than zero and is less than one. The well film is made of an $In_{X3}Ga_{1-X3}N$ semiconductor, where X3 is more than zero and less than one, and X3 is larger than X1.

Another aspect of the present invention relates to a method of forming a semiconductor device having a quantum well structure. The method comprises the steps of: forming a well film at a first temperature, the well film being made of a III-V nitride semiconductor containing nitrogen, indium and gallium; forming a first barrier film on the well film, the first barrier film being made of a III-V nitride semiconductor containing nitrogen, indium and gallium, and an indium composition of the first barrier film being smaller than an indium composition of the well film; after forming the first barrier film, rising a temperature to a second temperature without depositing a semiconductor film; prior to forming a second barrier film, keeping a temperature at the second temperature in a predetermined period of time without depositing a semiconductor film; and forming the second barrier film on the first barrier film at the second temperature, the second barrier film being made of a III-V nitride semiconductor, at least a portion of the first barrier film being formed in a period of time for rising temperature from the first temperature to a third temperature lower than the second temperature, the temperature in the temperature rising step being increased from the third temperature to the second temperature, and a period of time for the temperature rise from the first temperature to the third temperature being shorter than the predetermined period of time.

In the method according to the present invention, the predetermined period of time is not less than 1 minute nor more than 5 minutes.

In the method according to the present invention, the step of forming the first barrier film on the well film is carried out in a succession of the step of forming the well film at the first temperature.

In the method according to the present invention, the first barrier film is made of an $In_{X1}Ga_{1-X1}N$ semiconductor, where X1 is more than zero and less than one. The second barrier film is made of an $In_{X2}Ga_{1-X2}N$ semiconductor, where X2 is not less than zero and is less than one. The well film is made of an $In_{X3}Ga_{1-X3}N$ semiconductor, where X3 is more than zero and less than one, and X3 is larger than X1.

Another aspect of the present invention relates to a method of forming a semiconductor device having a quantum well structure. The method comprises the steps of: forming a first barrier film made of a III-V nitride semiconductor; after forming the first barrier film, changing temperature without depositing a semiconductor film; after the step of changing the temperature, forming a second barrier film on the first barrier film, the second barrier film being made of a III-V nitride semiconductor containing nitrogen, indium and gallium, an indium composition of the second barrier film being smaller than an indium composition of the well film; and forming a well film on the second barrier film at a first temperature, the well film being made of a III-V nitride semiconductor containing nitrogen, indium and gallium, the first barrier film being formed at a second temperature higher than the first temperature, the second barrier film being formed at a third temperature, the third temperature being lower than the second temperature and the third temperature being equal to or higher than the first temperature.

In the step of forming the second barrier film on the first barrier film according to the present invention, at least a portion of the second barrier film is formed at the first temperature.

In the method according to the present invention, the step of forming the well film on the second barrier film at the first temperature is carried out in a succession of the step of forming the second barrier film on the first barrier film.

In the method according to the present invention, the first barrier film is made of an $In_{X2}Ga_{1-X2}N$ semiconductor, where X2 is not less than zero and is less than one. The second barrier film is made of an $In_{X1}Ga_{1-X1}N$ semiconductor, where X1 is more than zero and less than one. The well film is made of an $In_{X3}Ga_{1-X3}N$ semiconductor, where X3 is more than zero and less than one, and X3 is larger than X1.

The method according to the present invention further comprises the steps of: forming a third barrier film on the well film, the third barrier film being made of a III-V nitride semiconductor containing nitrogen, indium and gallium, and an indium composition of the third barrier film being smaller than the indium composition of the well film; after forming the third barrier film, changing temperature without depositing a semiconductor film; and after the step of changing the temperature, forming a fourth barrier film on the third barrier film at a second temperature, the third barrier film being formed at a fourth temperature, the fourth temperature being lower than the second temperature and the fourth temperature being equal to or higher than the first temperature.

In the method according to the present invention, in the step of forming the third barrier film on the well film, at least a portion of the third barrier film is grown while changing a growth temperature.

The method according to the present invention further comprises the steps of: forming a third barrier film on the well film, the third barrier film being made of a III-V nitride semiconductor containing nitrogen, indium and gallium, and an indium composition of the third barrier film being smaller than the indium composition of the well film; after forming the third barrier film, rising a temperature without depositing a semiconductor film; and forming a fourth barrier film on the third barrier film at the second temperature, the fourth barrier film being made of a III-V nitride semiconductor, at least a portion of the third barrier film being formed during the temperature rise from the first temperature to a fourth temperature, the fourth temperature being lower than the second temperature, the temperature in the step of rising the temperature being increased from the fourth temperature to the second temperature in a predetermined period of time, and a period of time for the temperature rise from the first temperature to the fourth temperature being shorter than the predetermined period of time.

The method according to the present invention comprises the steps of: forming a third barrier film on the well film, the third barrier film being made of a III-V nitride semiconductor containing nitrogen, indium and gallium; after forming the third barrier film, rising a temperature to the second temperature without depositing a semiconductor film; after rising the temperature to the second temperature, keeping a temperature at the second temperature in a predetermined period of time without depositing a semiconductor film; and forming a fourth barrier film at the second temperature, the fourth barrier film being made of a III-V nitride semiconductor, at least a portion of the third barrier film being formed in a period of time for the temperature rise from the first temperature to a fourth temperature lower than the second temperature, the temperature in the step of rising the temperature being increased from the fourth temperature to the second temperature, and a period of time for the temperature rise from the first temperature to the fourth temperature being shorter than the predetermined period of time.

In the method according to the present invention, the predetermined period of time is not less than 1 minute nor more than 5 minutes.

In the method according to the present invention, the step of forming the third barrier film on the well film is carried out in a succession of the step of forming the well film on the second barrier film at the first temperature.

In the method according to the present invention, the fourth barrier film is made of an $In_{X5}Ga_{1-X5}N$ semiconductor, where X5 is not less than zero and is less than one. The third barrier film is made of an $In_{X4}Ga_{1-X4}N$ semiconductor, where X4 is more than zero and less than one, and where X3 is larger than X4.

Another aspect of the present invention relates to a semiconductor device having a quantum well structure. The semiconductor device comprises: a well region made of a III-V nitride semiconductor containing nitrogen, indium and gallium; and a first barrier region having a first semiconductor layer and a second semiconductor layer, the first semiconductor layer being made of a III-V nitride semiconductor containing nitrogen, indium and gallium, the second semiconductor layer being made of a III-V nitride semiconductor containing nitrogen and gallium, the first semiconductor layer being provided between the second semiconductor layer and the well region, and an indium composition of the first semiconductor layer being smaller than that of the well region.

In the semiconductor device according to the present invention, a defect density in the quantum well resulting from indium segregation is not more than $1 \times 10^6$ cm$^{-2}$.

The semiconductor device according to the present invention further comprises: a second barrier region having a third semiconductor layer and a fourth semiconductor layer, the third semiconductor layer being made of a III-V nitride semiconductor containing nitrogen, indium and gallium, the fourth semiconductor layer being made of a III-V nitride semiconductor containing nitrogen and gallium, the well region being provided between the first barrier region and the second barrier region, the third semiconductor layer being provided between the fourth semiconductor layer and the well region, and an indium composition of the third semiconductor layer being smaller than that of the well region.

In the semiconductor device according to the present invention, the first semiconductor layer is made of an $In_{X1}Ga_{1-X1}N$ semiconductor, where X1 is more than zero and less than one. The second semiconductor layer is made of an $In_{X2}Ga_{1-X2}N$ semiconductor, where X2 is not less than zero and is less than one. The well region is made of an $In_{X3}Ga_{1-X3}N$ semiconductor, where X3 is more than zero and less than one, X3 is larger than X1, and X3–X1 is not less than 0.04.

In the semiconductor device according to the present invention, a thickness of the first semiconductor layer is not less than 1 nanometer, and a thickness of the first semiconductor layer is not more than 5 nanometers.

In the semiconductor device according to the present invention, the fourth semiconductor layer is made of an $In_{X5}Ga_{1-X5}N$ semiconductor, where X5 is not less than zero and is less than one. The third semiconductor layer is made of an $In_{X4}Ga_{1-X4}N$ semiconductor, where X4 is more than zero and less than one, X3 is larger than X4, and X3–X4 is not less than 0.04.

In the semiconductor device according to the present invention, a thickness of the third semiconductor layer is not less than 1 nanometer, and a thickness of the third semiconductor layer is not more than 5 nanometers.

BRIEF DESCRIPTION OF THE DRAWINGS

The above-described object and other objects, features, and advantages of the present invention will become apparent more easily in the detailed description of the preferred embodiments of the present invention which will be described below with reference to the accompanying drawings.

FIGS. 2A, 2B and 2C are views showing the structures of an active region.

FIG. 4 is a view showing a potential barrier profile of an active region in a modified semiconductor optical device according to the first embodiment.

FIG. 5 is a view showing a potential barrier profile of an active region in a modified semiconductor optical device according to the first embodiment.

DESCRIPTION OF THE PREFERRED EMBODIMENTS

The teachings of the present invention will readily be understood in view of the following detailed descriptions with reference to the accompanying drawings illustrated by way of example. When possible, parts identical to each other will be referred to with numerals identical to each other.

(First Embodiment)

Figure 1:
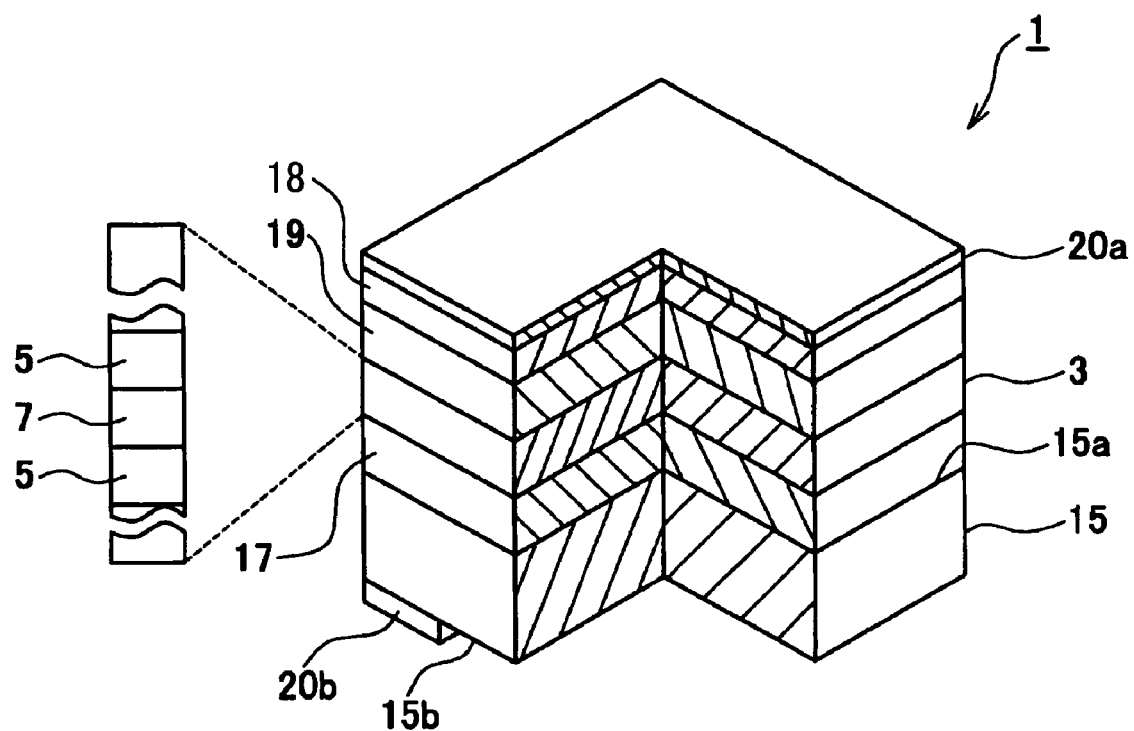
FIG. 1 is a view showing a semiconductor optical device.

FIG. 1 is a view showing a semiconductor optical device. FIG. 2A to FIG. 2C are views showing some examples of the active region in semiconductor optical device. The semiconductor device 1 includes an active region 3 having a quantum well structure. The active region 3 includes well regions 5 and barrier region 7. The well regions 5 are made of a III-V nitride semiconductor containing nitrogen (N), indium (In) and gallium (Ga). The barrier region 7 is made of a III-V nitride semiconductor containing nitrogen (N), indium (In) and gallium (Ga).

As shown in FIG. 2A, a barrier region 7a has a first semiconductor layer 9a and a second semiconductor layer 11a. The first semiconductor layer 9a is made of a III-V compound semiconductor containing at least nitrogen (N), indium (In) and gallium (Ga) The second semiconductor layer 11a is made of a III-V compound semiconductor containing at least nitrogen (N) and gallium (N), and may contain indium (In). The first semiconductor layer 9a is provided between the second semiconductor layer 11a and a well region 5a. The indium composition of the first semiconductor layer 9a is smaller than that of the well regions 5a and 5b. If the second semiconductor layer 11a contains indium, its indium composition is smaller than that of the first semiconductor layer 9a.

In this semiconductor device 1, the quantum well structure having an abrupt junction between the well region and the barrier region is formed because the first semiconductor layer 9a and the well region both contain indium and the first semiconductor layer 9a in the first barrier region 7a is provided between the second semiconductor layer 11a and the well region 5a.

As shown in FIG. 2B, a barrier region 7b has a third semiconductor layer 13b and a second semiconductor layer 11b. The third semiconductor layer 13b is made of a III-V compound semiconductor containing at least nitrogen (N), indium (In) and gallium (Ga). The second semiconductor layer 11b is made of a III-V compound semiconductor containing at least nitrogen (N) and gallium (Ga), and may further contain indium (In). The third semiconductor layer 13b is provided between the second semiconductor layer 11b and a well region 5b. If the second semiconductor layer 11b contains indium, its indium composition is smaller than that of the third semiconductor layer 13b. The indium composition of the third semiconductor layer 13b is smaller than that of well regions 5a and 5b.

Since the well region 5b and the third semiconductor layer 13b both contain indium and the third semiconductor layer 13b is provided between the second semiconductor layer 11b and the well region 5b, the semiconductor device 1 has a quantum well structure with an abrupt junction between the well region and the barrier region.

As shown in FIG. 2C, a barrier region 7c has a first semiconductor layer 9c, a second semiconductor layer 11c, and a third semiconductor layer 13c. The first semiconductor layer 9c is made of a III-V compound semiconductor containing at least nitrogen (N), indium (In) and gallium (Ga). The second semiconductor layer 11c is made of a III-V compound semiconductor containing at least nitrogen (N)

and gallium (Ga), and may further contain indium. The third semiconductor layer 13c is made of a III-V compound semiconductor containing at least nitrogen (N), indium (In) and gallium (Ga). The first semiconductor layer 9c is provided between the second semiconductor layer 11c and the well region 5a. The third semiconductor layer 13c is provided between the second semiconductor layer 11c and the well region 5b. If the second semiconductor layer 11c contains indium, its indium composition is smaller than those of the first semiconductor layer 9c and the third semiconductor layer 13c. The indium compositions of the first and third semiconductor layers 9c, 13c are smaller than that of the well regions 5a, 5b.

This semiconductor device 1 has a quantum well structure with abrupt junctions between the barrier region 7c and the well regions 5a and 5b because the first and third semiconductor layers 9c, 13c and the well regions 5a, 5b contain indium and the first and third semiconductor layers 9c, 13c are provided between the second semiconductor layer 11c and the well regions 5a, 5b, respectively.

With reference to FIG. 1, in the semiconductor optical device 1, the active region 3 is provided on a primary surface 15a of a support member 15. The support member 15 can be, for example, a gallium nitride substrate and the support member 15 may include a gallium nitride substrate and a gallium nitride layer provided thereon. The semiconductor optical device 1 may include a first conductivity type semiconductor layer 17 and a second conductivity type semiconductor layer 19. The active region 3 is provided between the second conductivity type semiconductor layer 19 and the first conductivity type semiconductor layer 17. The semiconductor optical device 1 may include a second conductivity type contact layer 18. The second conductivity type semiconductor layer 19 is provided between the second conductivity type contact layer 18 and the active region 3. In the semiconductor optical device 1, an electrode 20a is provided so as to cover the contact layer 18, and an electrode 20b is provided on a backside 15b of the support member 15.

As shown in FIG. 2A (and FIG. 2C), the first semiconductor layer 9a (9c) in the active region 3 is provided so as to cover the second semiconductor layer 11a (11c) of the barrier region 7a (7c). The well region 5a (5a) is provided on the barrier region 7a (7c). After the second semiconductor layer 11a (11c) of the barrier region 7a (7c) has been formed, the first semiconductor layer 9a (9c) of the composition different from that of the second semiconductor layer 11a (11c) is formed prior to forming the well region 5a (5a). If constituents of the first semiconductor layer 9a (9c) are substantially the same as those of the well region 5a (5a), the first semiconductor layer 9a (9c) can provide a base suitable for forming the well region 5a (5a).

As shown in FIG. 2B (and FIG. 2C), the barrier region 7b (7c) in the active region 3 is provided on the well region 5b (5b). The third semiconductor layer 13b (13c) is provided so as to cover the well region 5b (5b). After the well region 5b (5b) is formed, the third semiconductor layer 13b (13c) of the composition different from that of the second semiconductor layer 11b (11c) can be formed prior to forming the second semiconductor layer 11b (11c) of the barrier region 7b (7c). If constituents of the third semiconductor layer 13b (13c) are substantially the same as those of the well region 5b (5b), the well region 5b (5b) can be protected by use of the third semiconductor layer 13b (13c) during the formation of the second semiconductor layer 11b (11c).

In an example of a semiconductor optical device according to the present embodiment, the second semiconductor layer 11a, 11b, 11c of the respective barrier regions can be made of an $In_{X2}Ga_{1-X2}N$ semiconductor, where X2 is not less than zero and is less than one. The first and third semiconductor layers 9a, 9c, 13b, 13c of the respective barrier regions can be made of an $In_{X1}Ga_{1-X1}N$ semiconductor, where X1 is more than zero and less than one. The well regions 5a, 5b can be made of an $In_{X3}Ga_{1-X3}N$ semiconductor, where X3 is more than zero and less than one. Furthermore, X3 is larger than X2 and X1 is larger than X2 ($0 \leq X2 < X1 < X3$).

In a preferred example, the indium composition difference (X3−X1) between the first and third semiconductor layers 9a, 9c, 13b, 13c made of the $In_{X1}Ga_{1-X1}N$ semiconductor and the well regions 5a, 5b made of the $In_{X3}Ga_{1-X3}N$ semiconductor is not less than 0.04. Within this range ($0.04 \leq X3-X1$), the first and third semiconductor layers function as barrier layers and can confine carriers into the quantum well region. (X1−X2) is preferably not more than 0.02 and the first and third semiconductor layers having compositions in the above range ($X1-X2 \leq 0.02$) function as barrier region and are effective in confining the carrier into the quantum well region.

In a preferred example, the thickness D of the first and third semiconductor layers 9a, 9c, 13b, 13c is preferably not less than 1 nanometer. Within this thickness range ($D \leq 1$), the well region 5b can be protected during the formation of the second semiconductor layer 11a, 11c, and the first semiconductor layers 9a, 9c with a surface suitable for formation of the well region 5a can be formed on the second semiconductor layer 11a, 11c. In a preferred embodiment, the first and third semiconductor layers 9a, 9c, 13b, 13c have respective thickness values not more than 5 nanometers. Within the above thickness range, the second semiconductor layer 11a, 11b, 11c have respective thickness values sufficient to improve the crystal quality of the barrier region.

The thickness of the barrier region is preferably not less than 5 nanometers. Within this thickness range, at least two semiconductor layers can be formed. The thickness of the barrier region is preferably not more than 30 nanometers. The thickness over this range increases driving voltage for the semiconductor device and thus may shorten the lifetime thereof.

The detail of a light emitting diode is shown below as an example of the semiconductor optical device according to the present embodiment. This light emitting diode has the following structure:

supporting member: gallium nitride substrate;
n-type cladding layer: Si-doped GaN semiconductor layer;
barrier A layer: undoped GaN layer, 15 nm;
  repeating the formation of the following four layers five times:
  barrier B layer: undoped $In_{0.01}Ga_{0.99}N$ layer, 3 nm
  well layer: undoped $In_{0.15}Ga_{0.85}N$ layer, 2.5 nm
  barrier C layer: undoped $In_{0.01}Ga_{0.99}N$ layer, 3 nm
  barrier A layer: undoped GaN layer, 15 nm
p-type cladding layer: Mg-doped $Al_{0.15}Ga_{0.85}N$ semiconductor layer
p-type contact layer: Mg-doped GaN semiconductor layer.

Figure 6:
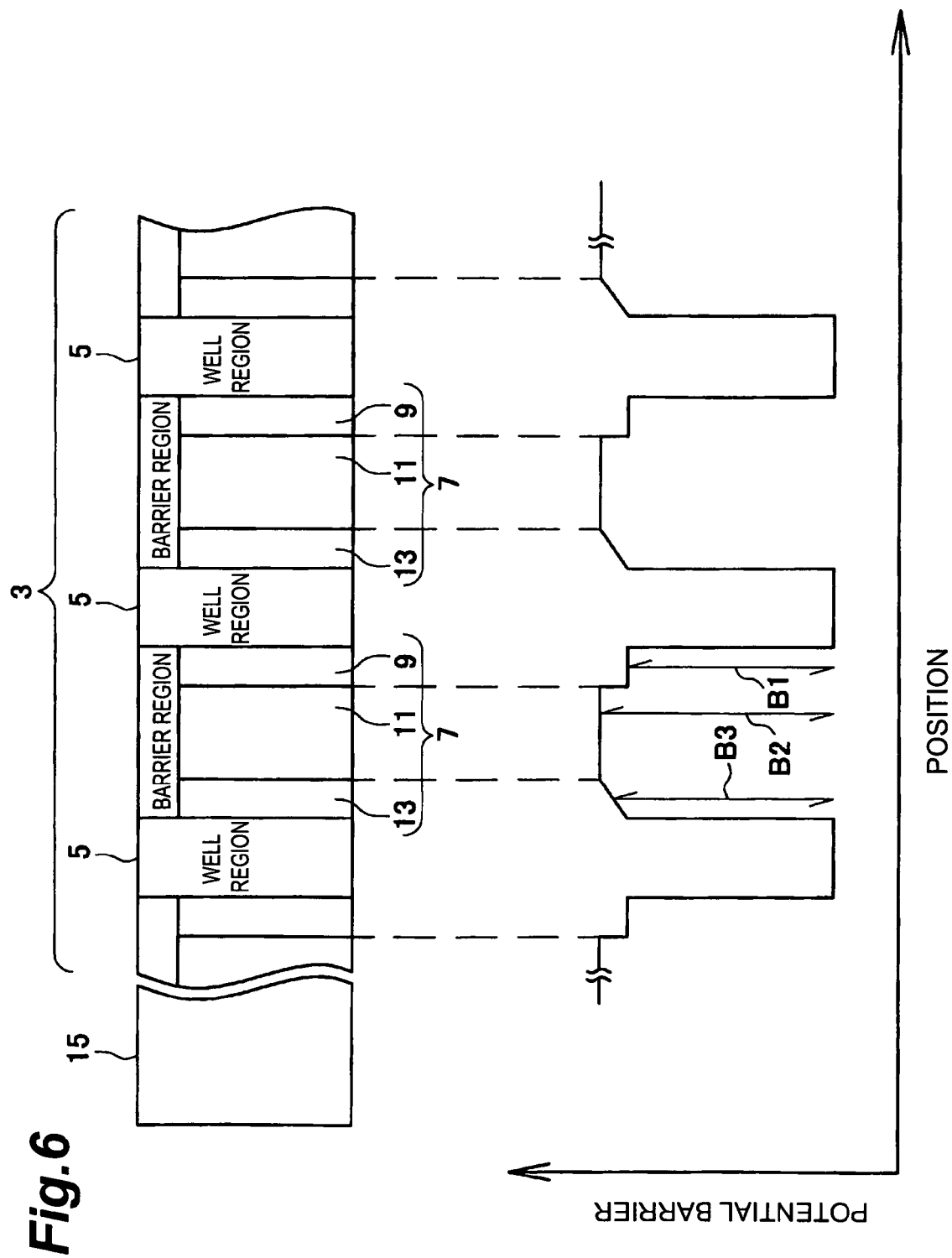
FIG. 6 is a view showing a potential barrier profile of an active region in a modified semiconductor optical device according to the first embodiment.

FIGS. 4, 5, and 6 are illustrations showing potential barriers of the active region in some modified semiconductor optical devices.

With reference to FIG. 4, a third semiconductor layer 13 is located between a second semiconductor layer 11 in the barrier region 7 and the well region 5. A relatively large potential barrier is formed between the third semiconductor layer 13 and the well region 5. The potential barrier monotonically changes in the third semiconductor layer 13 between the well region 5 and the second semiconductor layer 11. The well region 5, third semiconductor layer 13 and second semiconductor layer 11 are periodically arranged to form the active region 3. The barrier region has a number of semiconductor layers each having a different composition from each other and thus improves the periodicity of the active region 3. The potential barrier B2 of the second semiconductor layer 11 is larger than the potential barrier B3 of the third semiconductor layer 13.

With reference to FIG. 5, the third semiconductor layer 13 is located between the second semiconductor layer 11 of the barrier region 7 and the well region 5, and a first semiconductor layer 9 is located between the second semiconductor layer 11 and another well region 5. Relatively large potential barriers are formed in the following arrangements: between the third semiconductor layers 13 and the well region 5; between the first semiconductor layers 9 and the other well region 5. The potential barriers monotonically change in the first semiconductor layer 9 between the well region 5 and the second semiconductor layer 11 and in the third semiconductor layers 13 between the other well region 5 and the second semiconductor layer 11. The well region 5, first semiconductor layer 9, second semiconductor layer 11 and third semiconductor layer 13 are periodically arranged to form the active region 3. The barrier region has a number of semiconductor layers each having a composition different from each other and thus improves the periodicity of the active region 3. The potential barrier B2 of the second semiconductor layer 11 is larger than the potential barrier B1 of the first semiconductor layer 9. The potential barrier B2 of the second semiconductor layer 11 is also larger than the potential barrier B3 of the third semiconductor layer 13.

With reference to FIG. 6, the third semiconductor layer 13 is provided between the well region 5 and the second semiconductor layer 11 of the barrier region 7, and the first semiconductor layer 9 is located between the second semiconductor layer 11 and another well region 5. Large potential barriers are formed in the following arrangement: between the third semiconductor layer 13 and the well region 5; between the first semiconductor layer 9 and the other well regions 5. The potential barrier monotonically changes in the third semiconductor layer 13 between the well region and the second semiconductor layer 11. The potential barrier is almost constant in the first semiconductor layer 9 between the well region 5 and the second semiconductor layer 11. The well region 5, first semiconductor layer 9, second semiconductor layer 11 and third semiconductor layer 13 are periodically arranged to form the active region 3. The barrier region has a number of semiconductor layers each having a composition different from each other and thus improves the periodicity of the active region 3. The potential barrier B2 of the second semiconductor layer 11 is larger than the potential barrier B1 of the first semiconductor layer 9. The potential barrier B2 of the second semiconductor layer 11 is larger than the potential barrier B3 of the third semiconductor layer 13.

In the semiconductor optical devices according to the present embodiments as described above, the abrupt interfaces are formed between the well regions and the barrier regions in the quantum well structure.

(Second Embodiment)

Figure 7A:
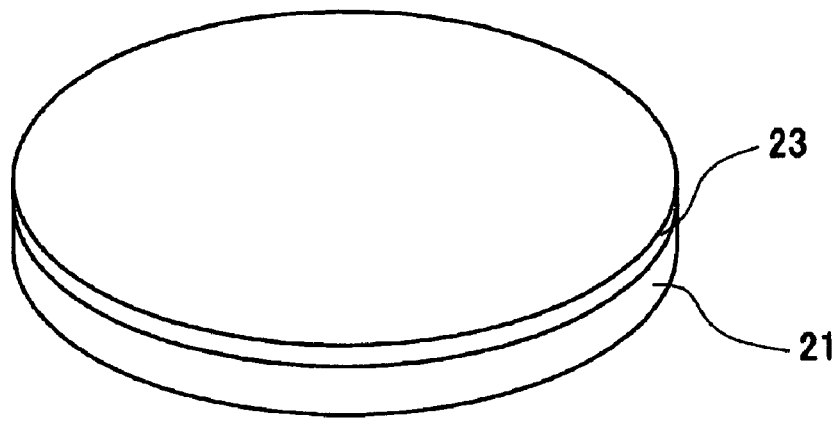
FIG. 7A and FIG. 7B are views explaining a method of forming a semiconductor device in the second embodiment of the present invention.
Figure 7B:
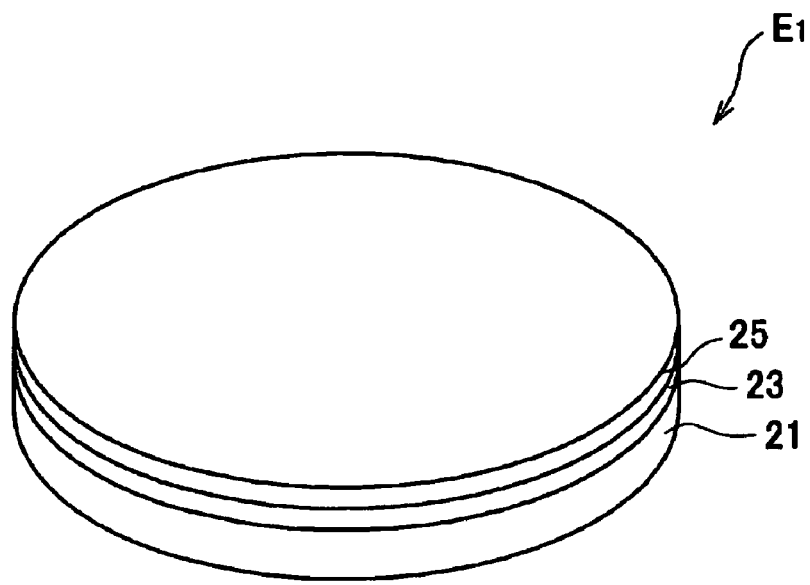

A method of forming a semiconductor device having a quantum well structure will be described below. FIG. 7A and FIG. 7B are illustrations explaining a method of forming a semiconductor device as shown as the second embodiment of the present invention.

With reference to FIG. 7A, a substrate is prepared. The substrate can be, for example, a single-crystal wafer made of gallium nitride. A gallium nitride film may be grown on this wafer, if required. For example, organometallic vapor phase epitaxy (OMVPE) can be used to form this gallium nitride film and other III-V nitride semiconductor films formed in subsequent production steps. Subsequently, a method of forming a semiconductor device by use of gallium nitride substrate 21 will be described. A III-V nitride semiconductor film, such as a gallium nitride layer 23, is grown on the gallium nitride substrate 21. The gallium nitride film 23 has an n type conductivity. The gallium nitride film 23 can work as a cladding layer, for example.

Figure 8A:
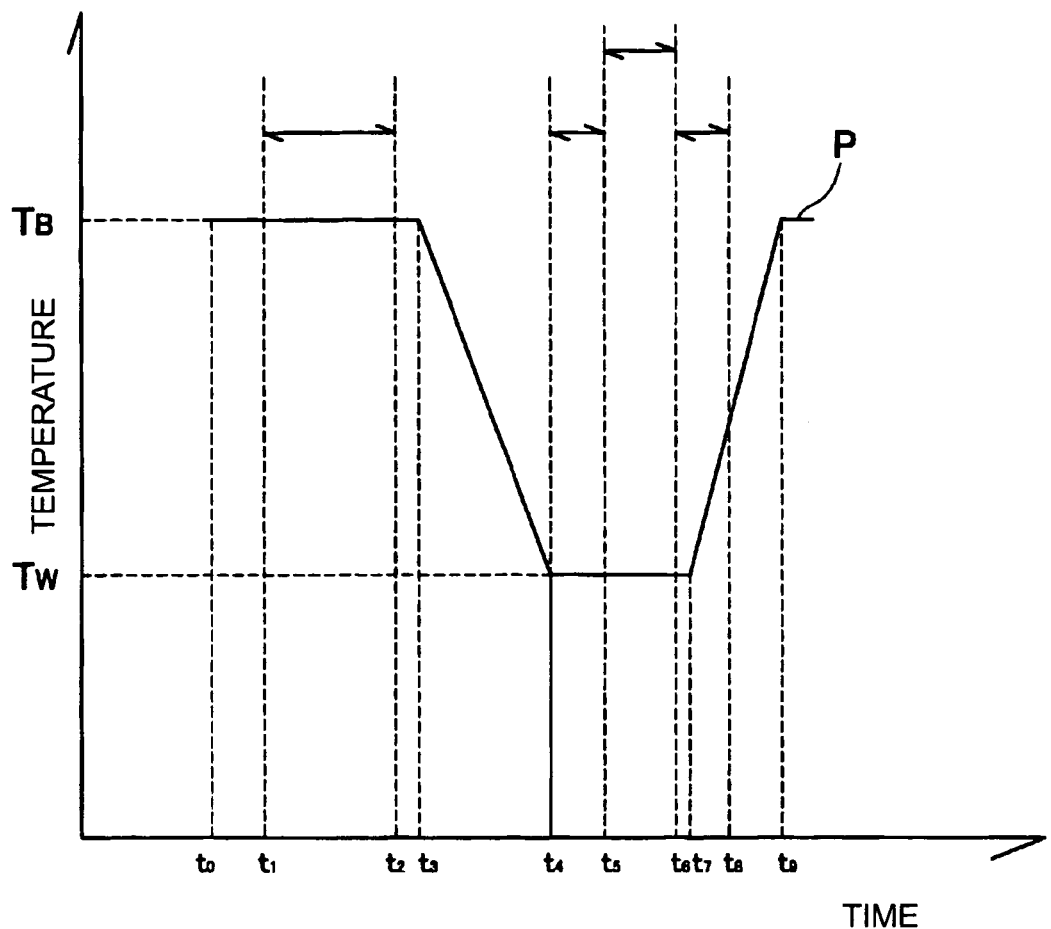
FIG. 8A is a view showing a temperature profile for forming a well layer and barrier layers.
Figure 8B:
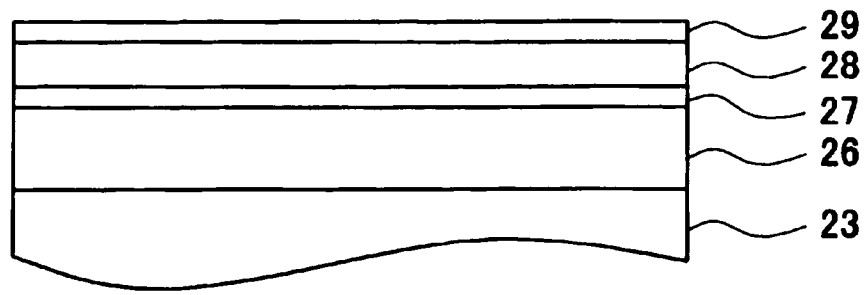
FIG. 8B is a view showing a quantum well structure fabricated using the temperature profile P shown in FIG. 8A.

With reference to FIG. 7B, an active region 25 is grown on the gallium nitride layer 23 to form a semiconductor substrate product $E_1$ like an epitaxial wafer. The active region 25 has a quantum well structure including well films and barrier semiconductor films. FIG. 8A is a diagram showing a temperature profile for forming a well film and barrier semiconductor films. FIG. 8B is an illustration showing a quantum well structure fabricated by use of the temperature profile P shown in FIG. 8A. With reference to FIG. 8B, a barrier A film 26, a barrier B film 27, a well film 28 and a barrier C film 29 are grown on the gallium nitride layer 23. As shown in FIG. 8A, at time $t_0$ an OMVPE apparatus is set at temperature $T_B$, e.g., 1000 degrees Celsius. The barrier A film 26 is formed at the temperature $T_B$ using a source gas therefor. The barrier A film 26 can be, for example, a III-V nitride semiconductor film, such as an undoped GaN film or an undoped InGaN film. The barrier A film 26 is grown in a period from time $t_1$ to time $t_2$. At time $t_2$, the supply of the source gas is terminated to complete the formation of the barrier A film 26. At time $t_3$, change of the temperature starts. At time $t_4$, the temperature is $T_W$. After the start of the temperature change, the barrier B film 27 is grown using a source gas therefor. In a period from time $t_4$ to time $t_5$, the barrier B film 27 is formed prior to forming the well film 28. The barrier B film 27 is made of a III-V nitride semiconductor containing at least nitrogen (N), indium (In) and gallium (Ga), for example, an undoped InGaN film. A part or the whole of the barrier B film 27 may be formed at the temperature $T_W$. In a preferred example, the barrier B film 27 is grown at the temperature $T_W$. At time $t_5$, the OMVPE apparatus is set at the preferred temperature $T_W$ for formation of the well film (e.g., 820 degrees Celsius) and the source gas for the barrier B film 27 is changed to the source gas for the well film 28. The well film 28 is formed at the temperature $T_W$. The well film 28 is made of a III-V nitride semiconductor containing at least nitrogen, indium and gallium. In a preferred example, the step of forming the well film 28 is performed continuously after the step of forming the barrier B film 27, so that the well layer 28 is grown substantially in succession to the barrier B film 27.

This method includes the step of changing the temperature without the formation of a semiconductor film after the step of forming the barrier A film 26. After the temperature has been changed, the barrier B film 27 is grown on the barrier A film 26 prior to the formation of the well film 28. Accordingly, an abrupt interface is provided between the well film 28 and the barrier B film 27. The barrier A film 26 is grown at the temperature $T_B$ higher than the temperature $T_W$. A part or the whole of the barrier B film 27 is grown at the temperature $T_W$. The indium composition of the barrier B film 27 is smaller than that of the well film 28. The barrier A film 26, the barrier B film 27 and the well film 28 can be, for example, an undoped GaN film, an undoped $In_{0.01}Ga_{0.99}N$ film and an undoped $In_{0.15}Ga_{0.85}N$ film, respectively.

At time $t_6$, the OMVPE apparatus is set at the temperature $T_W$, e.g., 820 degrees Celsius, suitable for the formation of the well film. In the present example, a source gas for the barrier C film is then supplied at time $t_6$ to grow the barrier C film 29 on the well film 28. For example, the source gas for the well film is changed to supply the source gas for the barrier C film. The barrier C film 29 is made of a III-V nitride semiconductor containing nitrogen, gallium and indium. The formation of the barrier C film 29 is started at the temperature $T_W$. At a certain time $t_7$ when the formation of the barrier C film 29 starts or after the start of the formation of the barrier C film 29 (i.e., $t_6 \leq t_7$), the temperature starts to change. After the start of the temperature rise, the supply of the source gas for the barrier C film is terminated. In a period from time $t_6$ to time $t_8$, the barrier C film 29 is grown. In this method, the step of changing the temperature without forming a film is provided between time $t_8$ and time $t_9$. At time $t_9$, the OMVPE apparatus is set at the temperature of $T_B$. Namely, the barrier C film 29 is formed at the temperature that is lower than the temperature $T_B$ and is not lower than the temperature $T_W$, and the indium composition of the barrier C film 29 is smaller than that of the well film 28. The barrier C film 29 can be, for example, an undoped $In_{0.01}Ga_{0.99}N$ film.

This method has the step of forming the barrier C film 29 which is performed prior to the step of changing the temperature without forming a film and after the formation of the well film 28. Accordingly, the junction between the well film 28 and the barrier C film becomes abrupt.

Figure 9A:
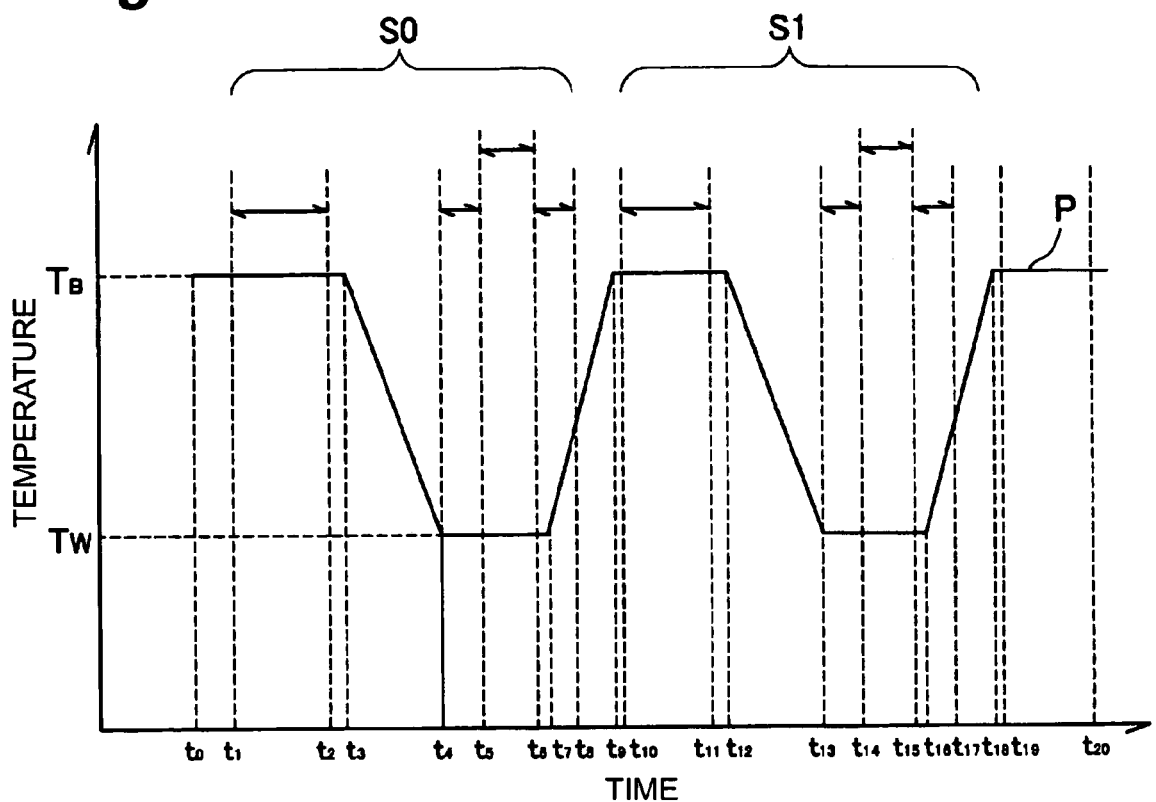
FIG. 9A is a view showing a temperature profile for forming well layers and barrier layers.
Figure 9B:
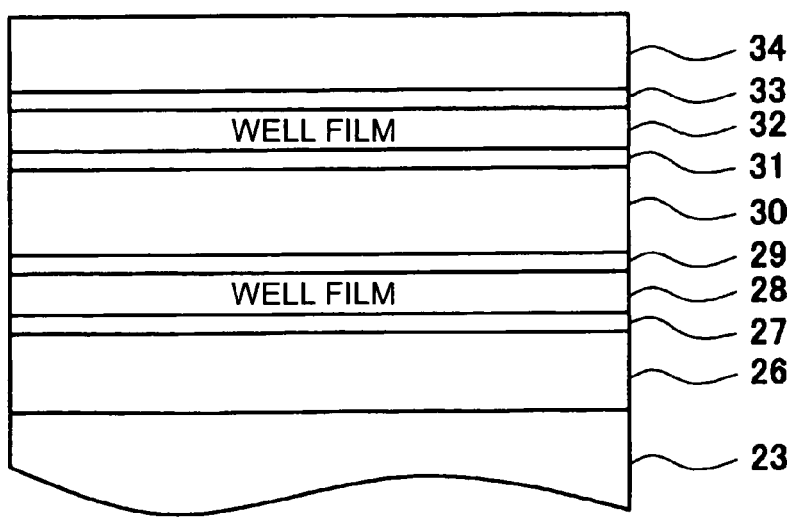
FIG. 9B is a view showing a quantum well structure fabricated using the temperature profile P shown in FIG. 9A.

FIG. 9A is a diagram showing a temperature profile for the formation of well films and barrier films. FIG. 9B is an illustration showing the quantum well structure fabricated by use of the temperature profile P shown in FIG. 9A. With reference to FIG. 9B, a barrier A film 30, a barrier B film 31, a well film 32 and a barrier C film 33 are further formed on the barrier C film 29. For forming these nitride semiconductor films, the sequence S1 shown in FIG. 9A is prepared, and this sequence is repeated by a number of times until the desired active region is formed. In the present embodiment, the sequence S1 is substantially the same as sequence S0 and time $t_1$ to $t_9$ in the sequence S0 correspond to time $t_{10}$ to $t_{18}$ in the sequence S0.

After repeating the sequence S1, a barrier A film 34 is formed on the barrier C film 33 in a period from time $t_{19}$ to time $t_{20}$. Then, the formation of the active region 25 is completed.

Figure 10A:
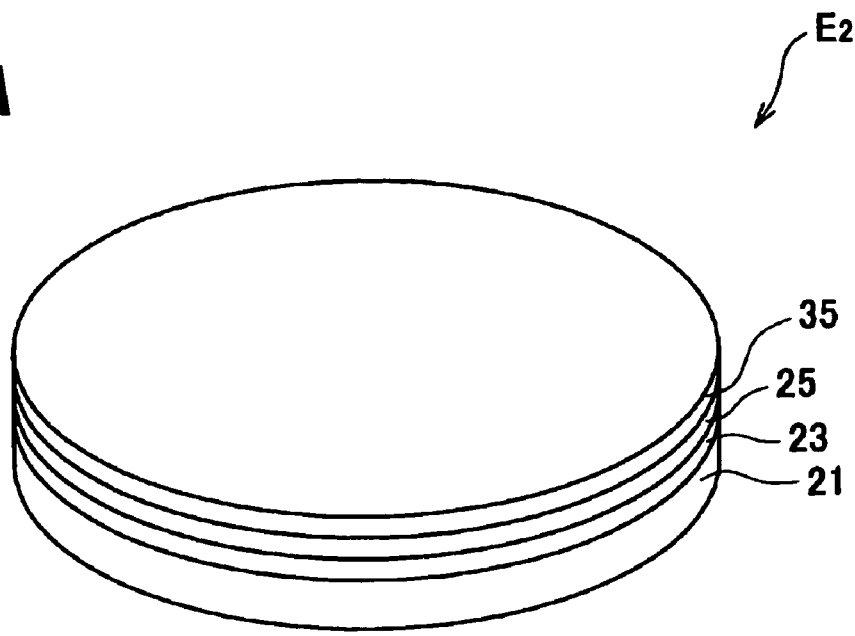
FIG. 10A and FIG. 10B are views explaining a method of forming a semiconductor device in the second embodiment of the present invention.
Figure 10B:
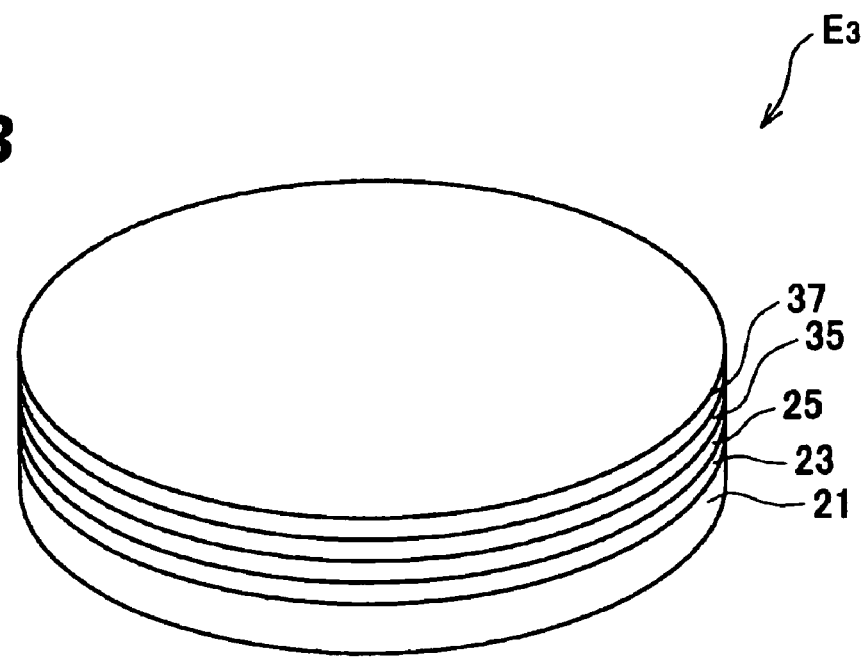

FIG. 10A and FIG. 10B are illustrations explaining a method of forming a semiconductor device in the second embodiment of the present invention. As shown in FIG. 10A, a III-V nitride film 35 containing at least nitrogen (N), aluminum (Al) and gallium (Ga) is formed on the active region 25 to provide a semiconductor substrate product $E_2$ such as an epitaxial wafer. The III-V nitride film 35 has the p type conductivity. The III-V nitride semiconductor film 35 is used as a cladding layer and is made of an AlGaN semiconductor, for example. Then, as shown in FIG. 10B, a III-V nitride semiconductor film 37 containing at least nitrogen and gallium is formed on the III-V nitride semiconductor film 35 to provide a semiconductor substrate product $E_3$ such as an epitaxial wafer. The III-V nitride semiconductor film 37 has the p type conductivity. The III-V nitride semiconductor film 37 is used as a contact layer and is made of GaN semiconductor, for example.

Although the present embodiment describes the formation of the barrier region having the barrier A film, the barrier B film and the barrier C film, a person skilled in the art can form another barrier region based on the description of the present embodiment, such as the barrier region having the barrier A film and the barrier B film or to form the barrier region having the barrier A film and the barrier C film.

Since the barrier B film and the barrier C film are made of the III-V nitride without aluminum, the bandgap of the barrier B film and the barrier C film is not larger than the bandgap of the barrier A film. Thus, the crystal quality of the barrier B film and the barrier C film is better than that of the AlGaN film grown at about 800 degrees Celsius and strain to the well film becomes small. Since the barrier B film is located under the well film, the well film does not touch the surface of the barrier A film which may be contaminated during the temperature change from the film formation temperature of the barrier A film to the growth temperature of the well film. Since the barrier C film is formed on the topside of the well film, the barrier C film prevents the decomposition of indium atoms from the well film during the temperature change from the temperature for formation of the well film to the temperature for growth of the barrier A film. Since the barrier B film and the barrier C film have indium compositions smaller than that of the well film, the cover of the barrier C film prevents the decomposition of indium atoms from the well film during the change of temperature of the film forming apparatus. Accordingly, good quality of the well layer is obtained. Since the barrier B film and the barrier C film that are thinner than the barrier A film are provided between the well film and the barrier A film, the barrier A film with good crystal quality can be formed at high temperatures.

The barrier A film such as the gallium nitride layer can be grown by step-flow using carrier gas $H_2$. In a preferred example, the growth temperature of the barrier A film is not lower than 900 degrees Celsius. The growth temperature of the barrier A film is preferably not higher than 1200 degrees Celsius. Accordingly, the crystal quality and flatness of the barrier semiconductor film be improved.

In a preferred example, the growth temperature of the well film depends on the desired indium composition thereof and is preferably not lower than 600 degrees Celsius and not higher than 900° C.

A part or the whole of the barrier B film and the barrier C film can be grown during the temperature change. This growth manner can reduce time period necessary for formation of the active region. This results in shortening the duration in which the well region is placed under temperatures higher than the temperature of forming itself.

In the case that a quantum well structure includes the well layers of InGaN and the barrier layers of GaN (or InGaN), the well layers are formed at the same temperature and in the same atmosphere as the barrier layers. As described above, the optimal deposition temperature for the barrier layers is higher than the optimal deposition temperature for the well layers. As the barrier layers are grown at the temperature higher than the temperature for depositing the well layers, the crystal quality of the barrier layers is improved. On the other hand, if the well layers are exposed to temperatures higher than the temperature of depositing itself, the constituents of the well layers are decomposed therefrom and one of constituents, e.g., indium, desorbs from the surface thereof. This desorption makes it difficult to obtain a quantum well structure with excellent abrupt interfaces, and if the barrier layers are formed at a low temperature, crystal defects is likely to occur therein.

Figure 3A:
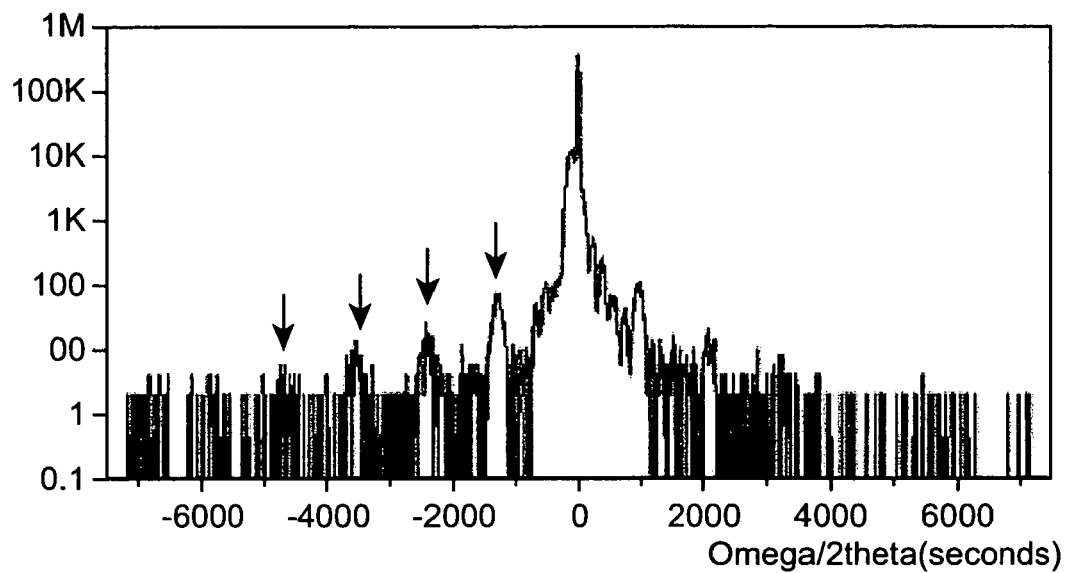
FIG. 3A is an XRD profile showing the measurement result of the (0002) surface in the quantum well structure having five well layers and barrier layers alternately arranged, the well layers and barrier layers being formed at the same temperature.
Figure 3B:
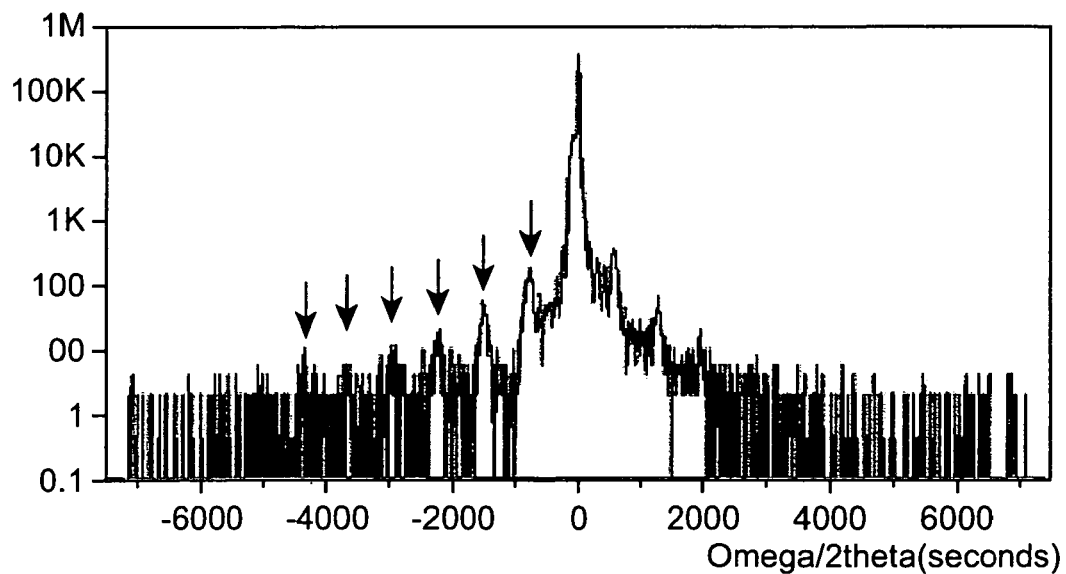
FIG. 3B is an XRD profile showing the measurement result of the (0002) surface in the quantum well structure including five well layers and barrier layers A, B, and C.

In the method according to the present embodiment, the additional barrier semiconductor film is formed prior to the growth of a well film, and thus improves the crystal quality of the well film. Since the additional barrier semiconductor film is formed after growth of the well film, the crystal quality of the well film and the abruptness of the interface between the well film and the barrier film are not deteriorated and the crystal quality of the barrier semiconductor films is improved. FIGS. 3A and 3B are views of XRD profiles for evaluation and FIG. 3B shows higher-order satellite peaks than FIG. 3A. The semiconductor light generating device, such as the light emitting diode, formed by this method demonstrates good emission characteristics.

Some embodiments has been described above, and FIG. 11A is an illustration showing a light emitting diode according to the present embodiment. Fabrication of the light emitting diode 51 will be described. A pretreatment (thermal cleaning) for GaN substrate 53 is carried out at about 1050 degrees Celsius in an atmosphere containing ammonia ($NH_3$) and hydrogen ($H_2$) for about ten minutes. After this pretreatment, a GaN semiconductor is grown at 1150 degrees Celsius on the GaN substrate 53 while being doped with silicon to obtain, for example, an n-type GaN film 55 of 2 micrometer thick. Then an InGaN semiconductor is grown at the temperature of 900 degrees Celsius to obtain, for example, an undoped (hereinafter abbreviated to "ud") $In_{0.01}Ga_{0.99}N$ film 57 of 15 nanometer thick. Thereafter the temperature is changed. An InGaN semiconductor is grown at 820 degrees Celsius to obtain, for example, an ud-$In_{0.015}Ga_{0.985}N$ film 59 of 3 nanometer thick. The ud-$In_{0.01}Ga_{0.99}N$ film 57 and ud-$In_{0.015}Ga_{0.985}N$ film 59 function as a lower cladding layer 61.

Subsequently, an InGaN semiconductor is grown at the temperature of 820 degrees Celsius to obtain, for example, an ud-$In_{0.15}Ga_{0.85}N$ film 65 of 2.5 nanometer thick. The ud-$In_{0.15}Ga_{0.85}N$ film 65 functions as a well region.

After the formation of the ud-$In_{0.15}Ga_{0.85}N$ film 65, the temperature is changed from 820 to 900 degrees Celsius. During this temperature change, an InGaN semiconductor is grown to obtain, for example, an ud-$In_{U}Ga_{1-U}N$ film 67 of 3 nanometer thick. The indium composition of the semiconductor film 67 decreases with distance from the well film. The ud-$In_{U}Ga_{1-U}N$ film 67 constitutes a part of a barrier region 73. In an example, a gas flow rate to form an $In_{0.015}Ga_{0.985}N$ film at 820 degrees Celsius is used.

After the temperature becomes stable at 900 degrees Celsius, an InGaN semiconductor is grown at the temperature to obtain, for example, an ud-$In_{0.01}Ga_{0.99}N$ film 69 of 12 nanometer thick. The ud-$In_{0.01}Ga_{0.99}N$ film 69 constitutes a part of the barrier region 73.

After the formation of the ud-$In_{0.01}Ga_{0.99}N$ film 69, the temperature is changed from 900 to 820 degrees Celsius. After the temperature becomes stable at 820 degrees Celsius, an InGaN semiconductor is grown at the temperature to obtain, for example, an ud-$In_{0.015}Ga_{0.985}N$ film 71 of 3 nanometer thick. The ud-$In_{0.015}Ga_{0.985}N$ film 71 constitutes a part of the barrier region 73.

These steps are repeated to finally form five well regions 65 and four barrier regions 73. After formation of these well regions 65 and barrier regions 73, an upper cladding layer 63 is grown. The temperature is changed from 820 to 900 degrees Celsius. During this temperature change, an InGaN semiconductor is grown to obtain, for example, an ud-$In_{V}Ga_{1-V}N$ film 72 of 3 nanometer thick. The indium composition of this semiconductor film 72 decreases with distance from the well film. The ud-$In_{V}Ga_{1-V}N$ film 72 constitutes a part of the upper cladding layer 63. In an example, a gas flow rate to form an $In_{0.015}Ga_{0.985}N$ film at 820 degrees Celsius is used. After the temperature becomes stable at 900 degrees Celsius, an InGaN semiconductor is grown at the temperature to obtain, for example, an ud-$In_{0.01}Ga_{0.99}N$ film 75 of 15 nanometer thick. The ud-$In_{0.01}Ga_{0.99}N$ film 75 constitutes a part of the upper cladding layer 63.

Subsequently, an Mg-doped AlGaN semiconductor is grown at the temperature of 1100 degrees Celsius to obtain, for example, a p-type $Al_{0.15}Ga_{0.85}N$ film 77 of 20 nanometer thick. The p-type $Al_{0.15}Ga_{0.85}N$ film 77 functions as a second cladding layer. Then, an Mg-doped GaN semiconductor is grown to obtain, for example, a p-type GaN film 79 of 50 nanometer thick. The p-type GaN film 79 functions as a contact layer.

Then, a cathode electrode 81 made of Ti/Al is formed on a back surface of the substrate 53, and a semi-transparent electrode 83 made of Ni/Au is formed on the contact layer. A pad electrode 85 made of Ti/Au is formed on the semi-transparent electrode 83.

Figure 11A:
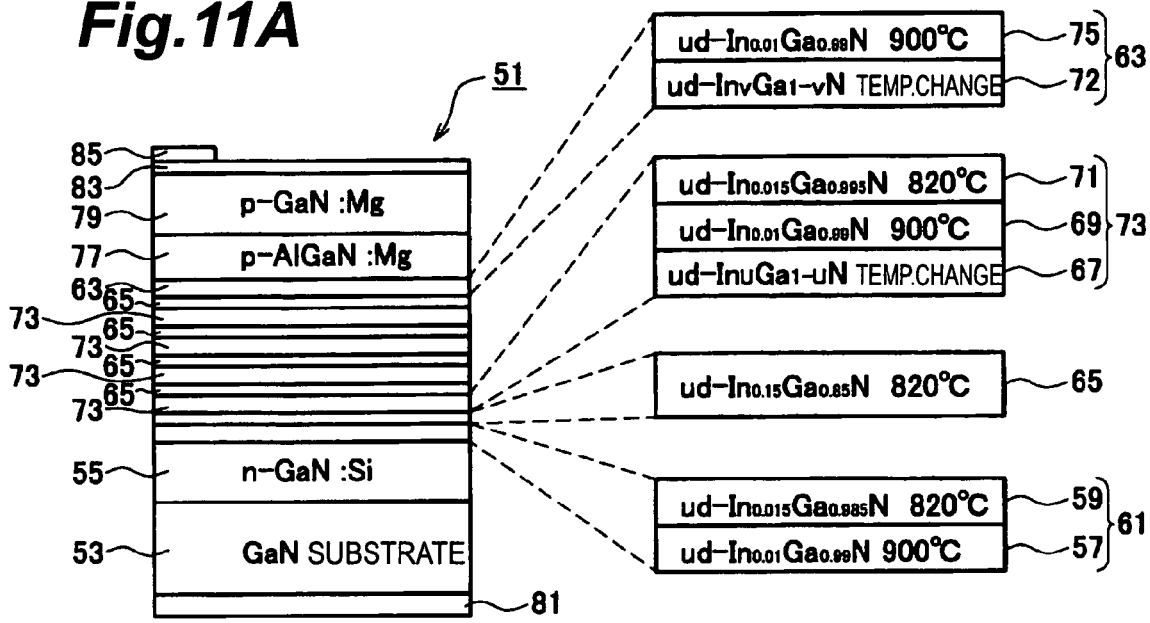
FIG. 11A is a view showing a light emitting diode according to the second embodiment.
Figure 11B:
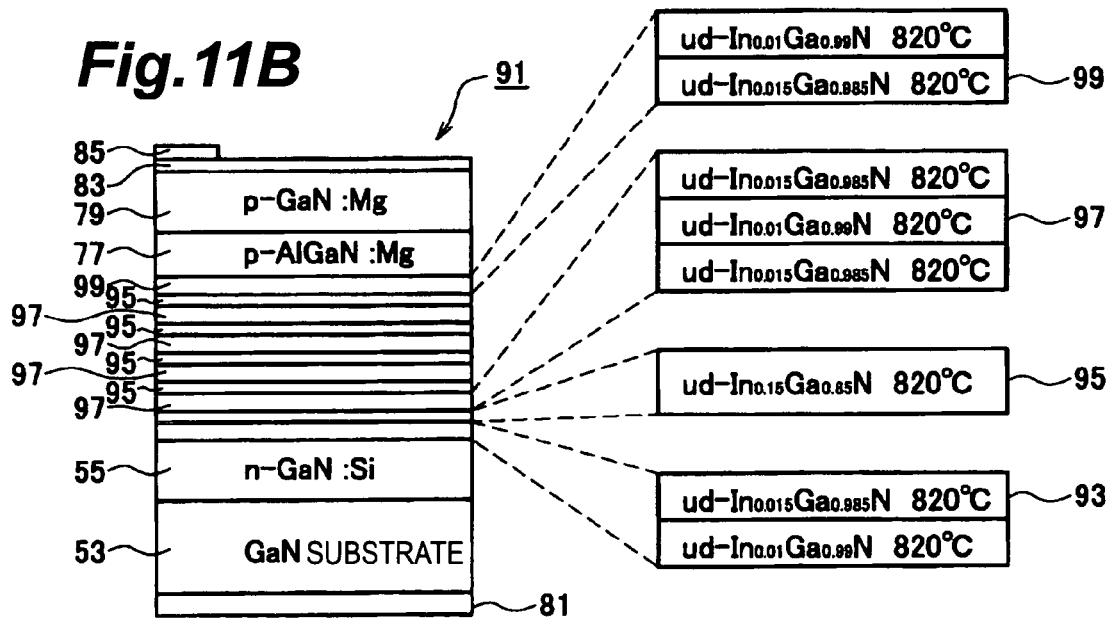
FIG. 11B is a view showing a light emitting diode having another structure.

FIG. 11B is an illustration showing a light emitting diode having another structure. Fabrication of the light emitting diode 91 will be described. In the case of the light emitting diode 91, particularly, a lower cladding layer 93, well regions 95, barrier regions 97, and an upper cladding layer 99 are formed at the same temperature, e.g., at 820 degrees Celsius.

Figure 12B:
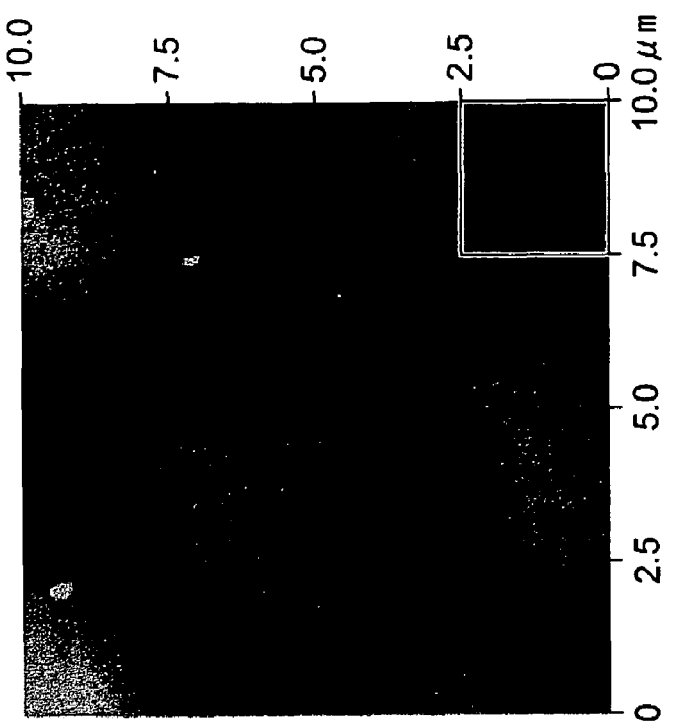
FIG. 12A and FIG. 12B are views showing atomic force microscope (AFM) images in the structures of FIG. 11A and FIG. 11B, respectively.
Figure 12A:
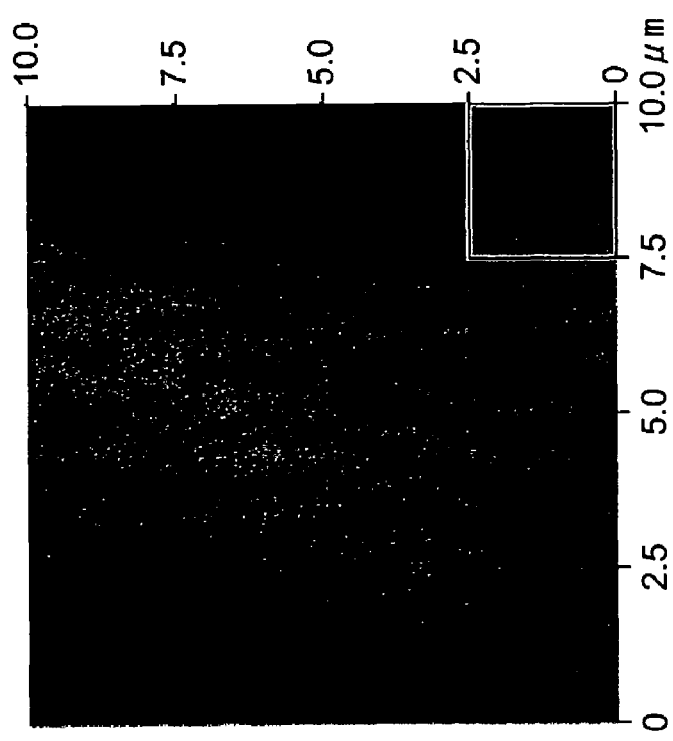

FIG. 12A and FIG. 12B are illustrations showing atomic force microscope (AFM) images in the structures of FIG. 11A and FIG. 11B, respectively. These AFM photographs show images of the surface of the quantum well structure (in the area of 10 $\mu m \times 10$ $\mu m$) without growth of the p-AlGaN layer and p-GaN layer. The AFM image shown in FIG. 12B corresponds to the light emitting diode with the well layers and barrier layers formed at the same temperature, and shows four defects resulting from indium segregation. On the other hand, the AFM image shown in FIG. 12A corresponds to the light emitting diode with the barrier layers formed at the temperature higher than the film formation temperature of the well layers, and shows no defect resulting from indium segregation. Assuming that an excellent MQW surface has the defect density of one or less in the dimensions of 10 $\mu m \times 10$ $\mu m$, the defect density is preferably not more than $1 \times 10^6$ per square centimeter ($1 \times 10^6$ $cm^{-2}$). The defects appearing in FIG. 12B result from indium segregation and are likely to appear at the relatively low temperature for depositing InGaN, where the In composition of InGaN is relatively high, where molar ratio [mole concentration of V group gas]/[mole concentration of III group gas] is relatively low in the growth of InGaN, and so on. By growing the barrier layers at the temperature higher than that of the well layers, it is feasible to improve the crystal quality of the active region and to suppress occurrence of the defects.

Figure 13A:
FIG. 13A is a view showing a fluorescence microscope image of a surface of an epitaxial layer for the light emitting diode shown in FIG. 11A.
Figure 13B:
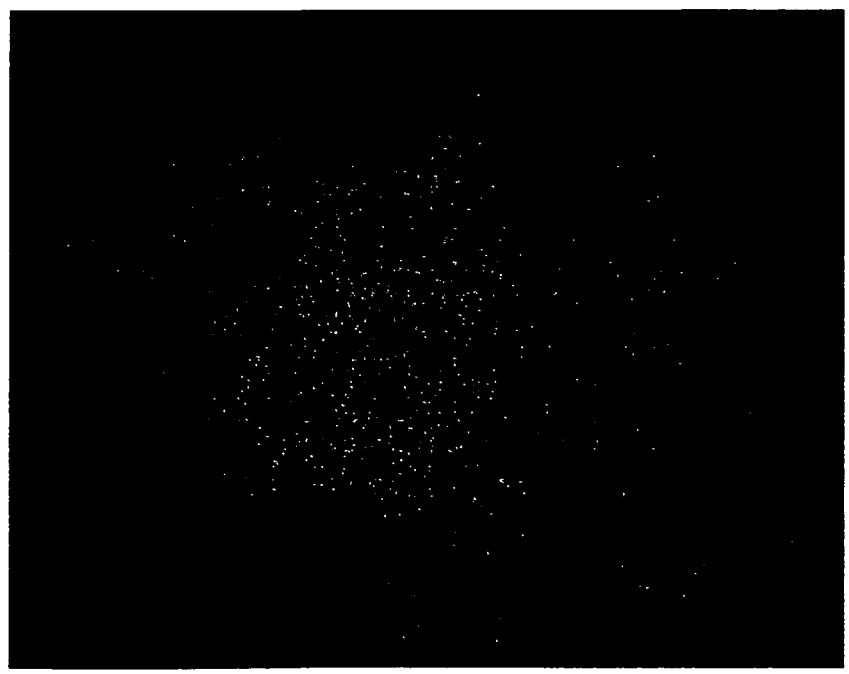
FIG. 13B is a view showing a fluorescence microscope image of a surface of an epitaxial layer for the light emitting diode shown in FIG. 11B.

FIG. 13A is a view of a fluorescence microscope image showing the surface of an epitaxial layer for the light emitting diode shown in FIG. 11A, and FIG. 13B a view of a fluorescence microscope image showing the surface of an epitaxial layer for the light emitting diode shown in FIG. 11B. These images are taken using excitation wavelength of 365 nanometers.

With reference to FIG. 13A, the crystal quality of the barrier film is excellent because the barrier region is formed at the temperature different from that of the well region. The light emitting diode 51 emits light of almost uniform intensity. On the other hand, with reference to FIG. 13B, the crystal quality of the barrier film is not so good because the barrier region is formed at the same temperature as the well region. The film quality of the well region is nonuniform and the light emitting diode 91 has some non-luminous regions.

At the emission wavelength of 450 nanometers, the optical power of the light emitting diode 51 is 2.5 times the optical power of the light emitting diode 91.

(Third Embodiment)

Figure 14A:
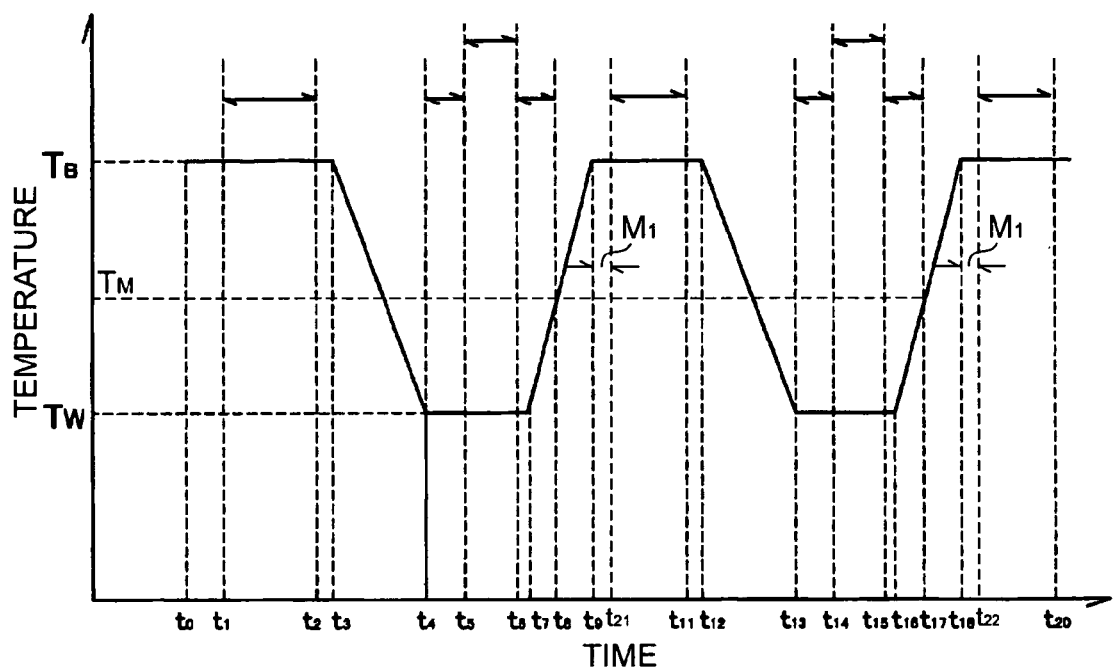
FIG. 14A is a view showing a temperature profile for a film formation in a method of forming a semiconductor device in the third embodiment according to the present invention.
Figure 14B:
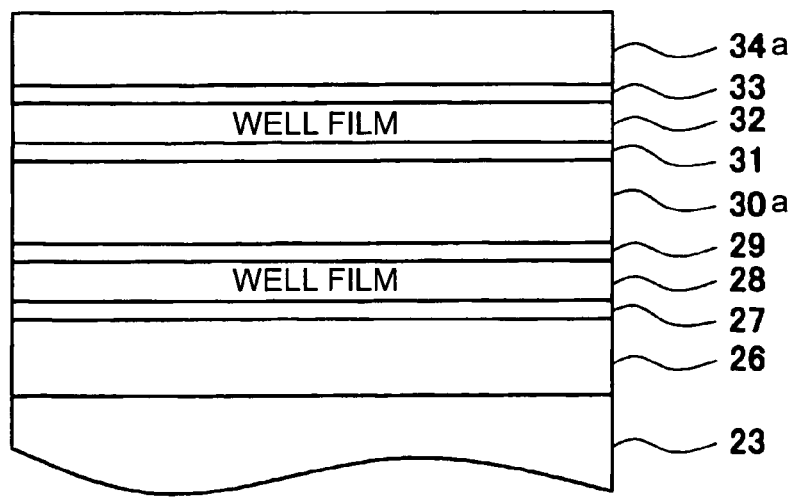
FIG. 14B is a view showing a structure of the semiconductor device fabricated by the method shown in FIG. 14A.

Next, a method of forming a semiconductor device having a quantum well structure will be described. FIG. 14A and FIG. 14B are illustrations explaining a method of forming a semiconductor device in the third embodiment of the present invention. This method is different in the following points from the embodiment shown in FIG. 9A and FIG. 9B: the temperature is increased in a period from time $t_7$ to $t_9$, the temperature is maintained at $T_B$ in a period $M_1$ between time $t_9$ and $t_{21}$ (instead of time $t_{10}$), and a barrier A film 30a is formed in a period from time $t_{21}$ to $t_{11}$. The temperature is increased in a period from time $t_{16}$ to $t_{18}$, the temperature is maintained at $T_B$ in a period $M_1$ from time $t_{18}$ to $t_{22}$ (instead of time $t_{19}$), and a barrier A film 34a is formed in a period between time $t_{22}$ and $t_{20}$.

In this example, the step of maintaining the temperature $T_B$ in the period $M_1$ without forming a semiconductor film is provided after the previous barrier formation. In this period $M_1$, atoms from the formed barrier film can migrate thereon at the temperature $T_B$ higher than both the film formation temperature of the well film and the temperature during the temperature rise. This results in improving the flatness of the surface of the barrier film and the crystal quality of the active region previously formed and can provide a base suitable for forming the subsequent barrier film.

Figure 15A:
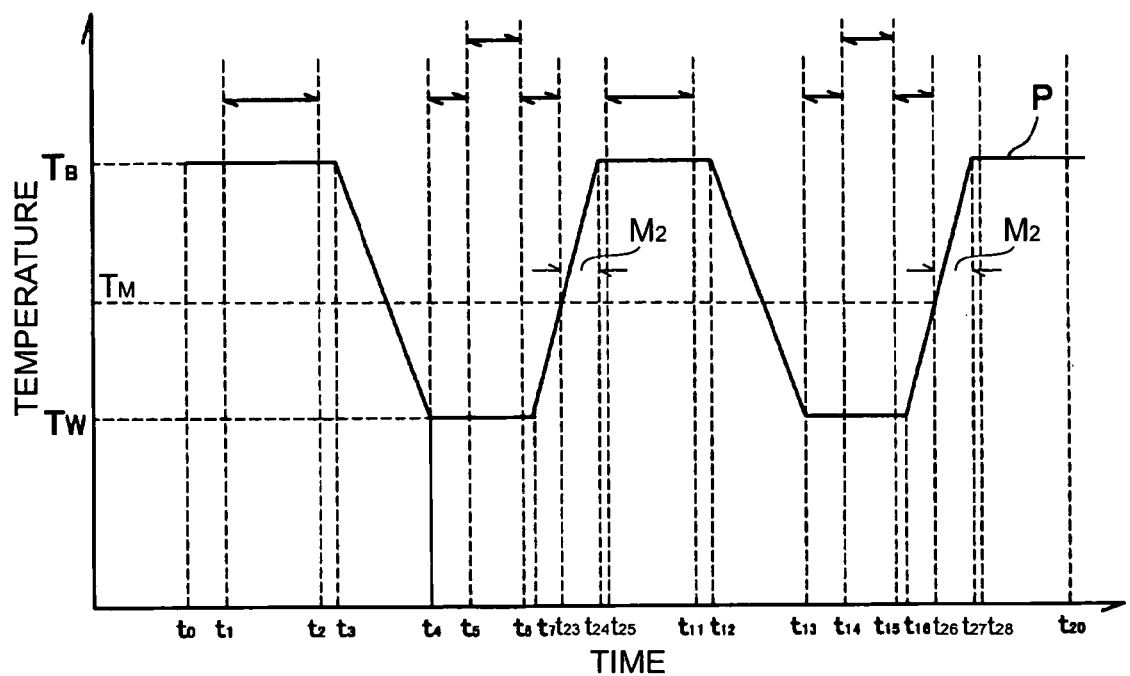
FIG. 15A is a view showing a temperature profile for a film formation in a modified method of forming the semiconductor device according to the third embodiment.
Figure 15B:
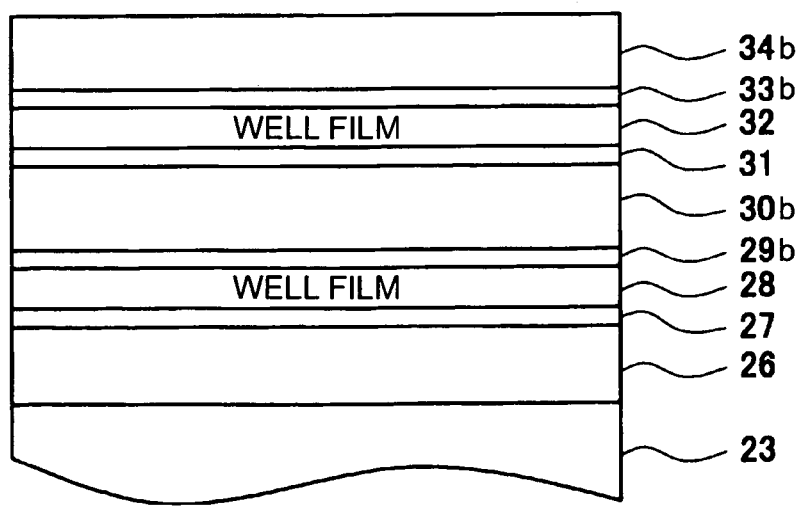
FIG. 15B is a view showing a structure of the semiconductor device fabricated by the method shown in FIG. 15A.

FIG. 15A and FIG. 15B are illustrations explaining a modified method of forming the semiconductor device in the third embodiment of the present invention. This method is different in the following points from the embodiment shown in FIG. 9A and FIG. 9B: the temperature is increased in a period from time $t_7$ to $t_{24}$, and a barrier C film 29b is formed in a period from time $t_6$ to $t_{23}$ (instead of time $t_8$). The temperature is increased without forming a film in a period $M_2$ from time $t_{23}$ to $t_{24}$ and, a barrier A film 30b is formed in a period from time $t_{25}$ (instead of time $t_{10}$) to $t_{11}$ after the temperature becomes stable. The temperature is increased in a period from time $t_{16}$ to time $t_{27}$ and a barrier C film 33b is formed in a period from time $t_{15}$ to time $t_{26}$ (instead of time $t_{17}$). The temperature is increased without forming a film in a period $M_2$ from time $t_{26}$ to time $t_{27}$ and, a barrier A film 34b is formed in a period from time $t_{28}$ (instead of time $t_{19}$) to time $t_{20}$ after the temperature becomes stable.

In this modified example, the step of changing the temperature without forming a semiconductor film is provided after the previous barrier formation. This step permits atoms from the formed barrier film to migrate thereon. This results in improving the flatness of the surface of the barrier film and the crystal quality of the active region as compared to conventional devices, and can provide a base surface suitable for the subsequent barrier film formation.

Figure 16A:
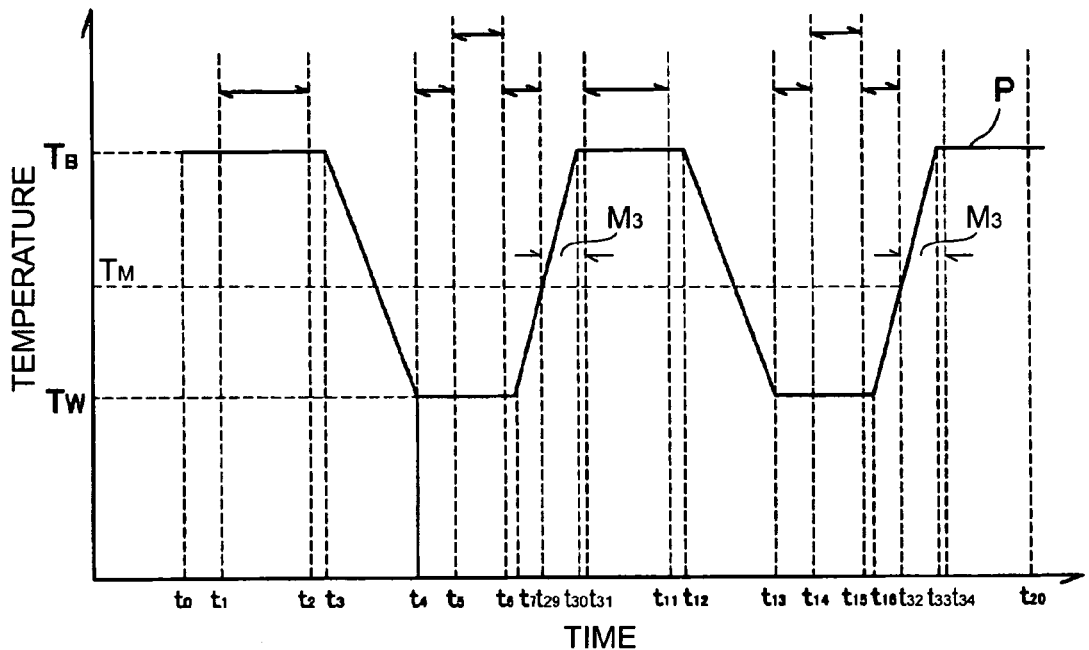
FIG. 16A is a view showing a temperature profile of a film formation in another modified method of forming the semiconductor device according to the third embodiment.
Figure 16B:
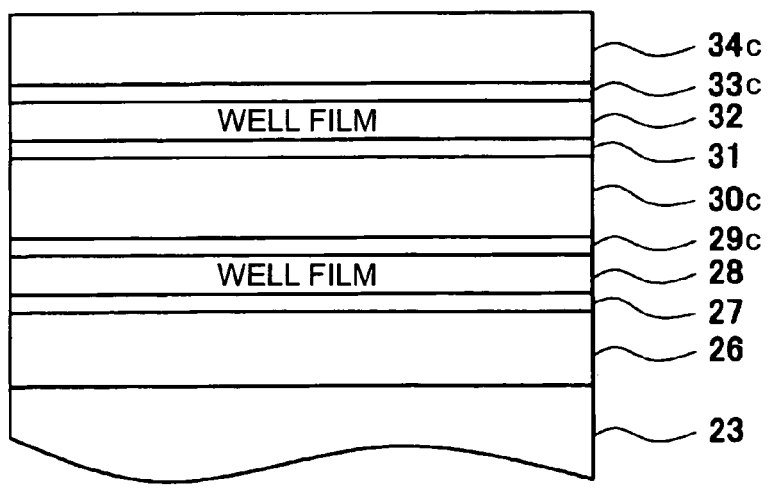
FIG. 16B is a view showing a structure of the semiconductor device fabricated by the method shown in FIG. 16A.

FIG. 16A and FIG. 16B are illustrations explaining a modified method of forming the semiconductor device in the third embodiment of the present invention. This method is different in the following points from the embodiment shown in FIG. 9A and FIG. 9B: a barrier C film 29c is formed in a period from time $t_6$ to $t_{29}$ (instead of time $t_8$); the temperature is increased without forming a semiconductor film in a period from time $t_{29}$ to $t_{30}$; the temperature is maintained at $T_B$ in a period from time $t_{30}$ to $t_{31}$. After the temperature becomes stable, a barrier A film 30c is formed in a period from time $t_{31}$ (instead of time $t_{10}$) to $t_{11}$. A barrier C film 33c is formed in a period from time $t_{15}$ to $t_{32}$ (instead of time $t_{17}$), the temperature is increased without forming a film in a period from time $t_{32}$ to time $t_{33}$, and the temperature is maintained at $T_B$ in a period from time $t_{33}$ to $t_{34}$. After the temperature becomes stable, a barrier A film 34c is formed in a period from time $t_{34}$ (instead of time $t_{19}$) to $t_{20}$.

In this modified example, after the previous barrier formation, the step of changing the temperature without forming a semiconductor film and the step of maintaining the temperature is provided. These steps permit atoms from the formed barrier film to migrate thereon. This results in improving the flatness of the surface of the barrier film and the crystal quality of the active region and can provide a base surface suitable for the subsequent barrier film formation.

As described above, any film formation is not carried out in the periods $M_1$ (e.g., the period from time $t_9$ to $t_{21}$), $M_2$ and $M_3$ to provide the previously grown semiconductor films with the thermal treatment in these examples and modifications. These periods enables atoms from the third barrier film to migrate thereon. In order to implement the migration of a sufficient amount of atoms, it is preferable to perform the thermal treatment at the temperature $T_M$ over 860 degrees Celsius, for example.

The periods $M_1$, $M_2$ and $M_3$ are preferably not less than one minute nor more than five minutes. In this method, sufficient migration will not occur if the period of increasing the temperature without forming a semiconductor film or the period of maintaining the temperature without forming a semiconductor film is too short. If these periods are too long, the emission characteristics of the light emitting device in not improved because of the contamination of the growing surface and/or degradation of crystal quality of the active layer.

Figure 17B:
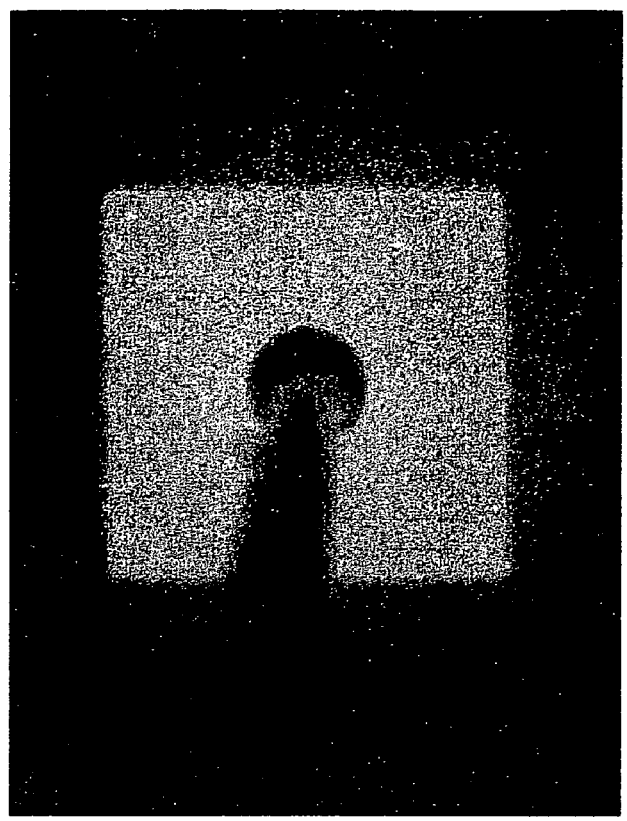
FIG. 17A and FIG. 17B are views showing luminous images of light emitting diodes.
Figure 17A:
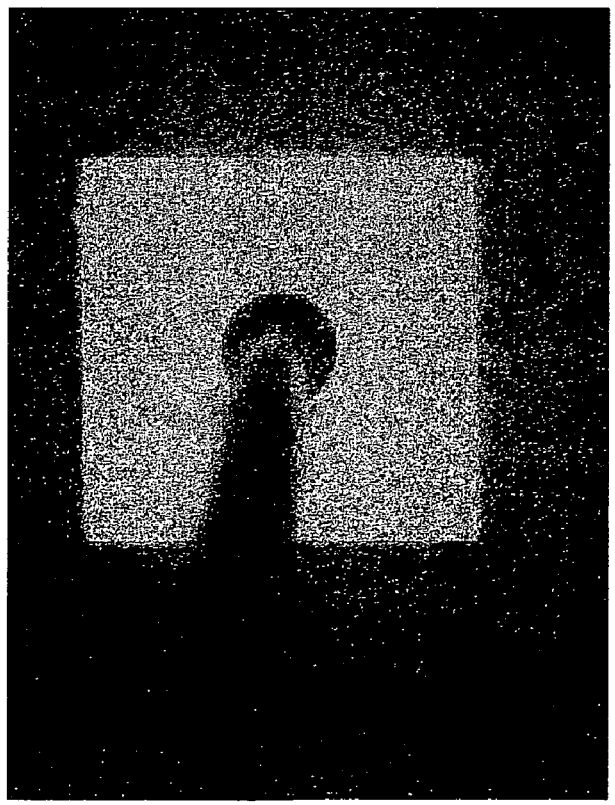

FIG. 17A and FIG. 17B are views showing emission images of light emitting diodes. The structure of these light emitting diodes is substantially the same as the structure shown in FIG. 11A. In fabrication of the light emitting diode shown in FIG. 17A, after the InGaN layers 67 and 72 are grown with change of temperature in the period of 30 seconds, two minutes are prepared for the temperature rise period to 900 degrees Celsius and the temperature maintaining period for stabilization. In the fabrication of the light emitting diode shown in FIG. 17B, the first barrier layer is grown with a temperature rise to 900 degrees Celsius in a period of 2.5 minutes immediately after the formation of the well films 65, 71, and thus "period of changing temperature without forming a film" is not provided unlike the fabrication of the light emitting diode shown in FIG. 17A. In these light emitting diodes, the first barrier layer is formed in the same thickness by controlling the growth rate.

These light emitting devices have the same emission intensity. With reference to FIG. 17A, the light emitting device exhibits uniform intensity of light, whereas with reference to FIG. 17B, luminescent spots are observed in the luminous surface. The occurrence of these luminescent spots results from the crystal quality of each barrier layer formed with a temperature rise. It is thought that the barrier layer has a region with a poor crystal quality which is formed near the well layer and is not recovered with the growth thereof and that the poor crystal quality adversely affects the growth of the next well layer. Since the well layers are made of InGaN with high In composition, the quality thereof is likely to deteriorate if the crystal quality of the base surface is not good.

In the fabrication of the light emitting diode shown in FIG. 17A, the migration of atoms occurs in the vicinity of the surface of the first barrier film in the period of changing the temperature without forming a semiconductor film, thereby achieving good crystal quality and flatness of the first barrier film. That is, the crystal quality of the active layer can be recovered by providing the foregoing intermission of growth, in addition to the growth of the barrier at the temperature higher than that of the well layer, so that the quality of the active layer can be further enhanced.

In Document 4, there are two barrier layers are provided on the well film and the first barrier layer is grown with increasing temperature and the second barrier layer is grown after the temperature becomes constant at a high temperature. The growth conditions are changed for formation of the second barrier layer so as to increase the growth rate and the partial pressure of hydrogen ($H_2$), and decrease the V/III molar ratio. The first barrier layer is grown with increasing temperature by the method in Document 4, and the first and the second barrier layers are continuously formed. Although it is thought that the crystal quality of the first barrier layer is gradually improved in this method as the first barrier layer grows, the first barrier layer has a region near the well layer the crystal quality of which is insufficient. The poor crystal quality of the above region near the well layer results in failure in improvement in the quality of the film formed thereon, and the insufficient crystal quality becomes evident with increase in the total thickness of the active layer. Therefore, there is a limit to improvement in the quality of the interfaces in the MQW structure most significant for achievement of high luminance.

Having described and illustrated the principle of the invention in a preferred embodiment thereof, it is appreciated by those having skill in the art that the invention can be modified in arrangement and detail without departing from such principles. For example, the embodiments according to the present invention describe semiconductor optical device, such as a light emitting diode, but the present invention is not limited to the quantum well structures for the light emitting layers. In addition, the present invention can also be used for other semiconductor devices having the quantum well structure, besides the semiconductor light emitting devices. Details of structures of these devices can be modified as necessary. We therefore claim all modifications and variations coming within the spirit and scope of the following claims.

What is claimed is:

1. A method of forming a semiconductor device having a quantum well structure, comprising the steps of:
   forming a well film at a first temperature, the well film being made of a III-V nitride semiconductor containing nitrogen, indium and gallium;
   forming a first barrier film on the well film, the first barrier film being made of a III-V nitride semiconductor containing nitrogen, indium and gallium, and an indium composition of the first barrier film being smaller than that of the well film;
   after forming the first barrier film, changing temperature without depositing a semiconductor film; and
   after changing the temperature, forming a second barrier film at a second temperature higher than the first temperature, the second barrier film being made of a III-V nitride semiconductor on the first barrier film, the first barrier film being formed at a third temperature, the third temperature being equal to or higher than the first temperature, and the third temperature being lower than the second temperature.

2. The method according to claim 1, wherein in the step of forming the first barrier film on the well film, at least a portion of the first barrier film is grown while changing a growth temperature.

3. The method according to claim 1, wherein the step of forming the first barrier film on the well film is carried out in a succession of the step of forming the well film at the first temperature.

4. The method according to claim 1, wherein the first barrier film is made of an $In_{X1}Ga_{1-X1}N$ semiconductor, where X1 is more than zero and less than one,
   wherein the second barrier film is made of an $In_{X2}Ga_{1-X2}N$ semiconductor, where X2 is not less than zero and is less than one, and
   wherein the well film is made of an $In_{X3}Ga_{1-X3}N$ semiconductor, where X3 is more than zero and less than one, and X3 is larger than X1.

5. A method of forming a semiconductor device having a quantum well structure, comprising the steps of:
   forming a well film at a first temperature, the well film being made of a III-V nitride semiconductor containing nitrogen, indium and gallium;
   forming a first barrier film on the well film, the first barrier film being made of a III-V nitride semiconductor containing nitrogen, indium, and gallium, an indium composition of the first barrier film being smaller than an indium composition of the well film;
   after forming the first barrier film, rising a temperature without depositing a semiconductor film; and
   forming a second barrier film on the first barrier film at a second temperature, the second barrier film being made of a III-V nitride semiconductor, at least a portion of the first barrier film being formed during a temperature rise from the first temperature to a third temperature, the temperature in the step of rising a temperature being increased from the third temperature to the second temperature in a predetermined period of time, and a period of time for the temperature rise from the first temperature to the third temperature being shorter than the predetermined period of time.

6. The method according to claim 5, wherein the predetermined period is not less than one minute nor more than five minutes.

7. The method according to claim 5, wherein the step of forming the first barrier film on the well film is carried out in a succession of the step of forming the well film at the first temperature.

8. The method according to claim 5, wherein the first barrier film is made of an $In_{X1}Ga_{1-X1}N$ semiconductor, where X1 is more than zero and less than one,
   wherein the second barrier film is made of an $In_{X2}Ga_{1-X2}N$ semiconductor, where X2 is not less than zero and is less than one, and
   wherein the well film is made of an $In_{X3}Ga_{1-X3}N$ semiconductor, where X3 is more than zero and less than one, and X3 is larger than X1.

9. A method of forming a semiconductor device having a quantum well structure, comprising the steps of:
   forming a well film at a first temperature, the well film being made of a III-V nitride semiconductor containing nitrogen, indium and gallium;
   forming a first barrier film on the well film, the first barrier film being made of a III-V nitride semiconductor containing nitrogen, indium and gallium, and an indium composition of the first barrier film being smaller than an indium composition of the well film;
   after forming the first barrier film, rising a temperature to a second temperature without depositing a semiconductor film;
   prior to forming a second barrier film, keeping a temperature at the second temperature in a predetermined period of time without depositing a semiconductor film; and
   forming the second barrier film on the first barrier film at the second temperature, the second barrier film being made of a III-V nitride semiconductor, at least a portion of the first barrier film being formed in a period of temperature rise from the first temperature to a third temperature lower than the second temperature, the temperature in the step of rising the temperature being increased from the third temperature to the second temperature, and a period of time for the temperature rise from the first temperature to the third temperature being shorter than the predetermined period of time.

10. The method according to claim 9, wherein the predetermined period is not less than one minute nor more than five minutes.

11. The method according to claim 9, wherein the step of forming the first barrier film on the well film is carried out in a succession of the step of forming the well film at the first temperature.

12. The method according to claim 9, wherein the first barrier film is made of an $In_{X1}Ga_{1-X1}N$ semiconductor, where X1 is more than zero and less than one,
   wherein the second barrier film is made of an $In_{X2}Ga_{1-X2}N$ semiconductor, where X2 is not less than zero and is less than one, and
   wherein the well film is made of an $In_{X3}Ga_{1-X3}N$ semiconductor, where X3 is more than zero and less than one, and X3 is larger than X1.

13. A method of forming a semiconductor device having a quantum well structure, comprising the steps of:
   forming a first barrier film made of a III-V nitride semiconductor;
   after forming the first barrier film, changing temperature without depositing a semiconductor film;
   after the step of changing the temperature, forming a second barrier film on the first barrier film, the second barrier film being made of a III-V nitride semiconductor containing nitrogen, indium and gallium, an indium composition of the second barrier film being smaller than an indium composition of the well film; and
   forming a well film on the second barrier film at a first temperature, a well film being made of a III-V nitride semiconductor containing nitrogen, indium and gallium, the first barrier film being formed at a second temperature higher than the first temperature, the second barrier film being formed at a third temperature, the third temperature being lower than the second temperature and the third temperature being equal to or higher than the first temperature.

14. The method according to claim 13, wherein in the step of forming the second barrier film on the first barrier film, at least a portion of the second barrier film is formed at the first temperature.

15. The method according to claim 13, wherein the step of forming the well film on the second barrier film at the first temperature is carried out in a succession of the step of forming the second barrier film on the first barrier film.

16. The method according to claim 13, wherein the first barrier film is made of an $In_{X2}Ga_{1-X2}N$ semiconductor, where X2 is not less than zero and is less than one,
   wherein the second barrier film is made of an $In_{X1}Ga_{1-X1}N$ semiconductor, where X1 is more than zero and less than one, and
   wherein the well film is made of an $In_{X3}Ga_{1-X3}N$ semiconductor, where X3 is more than zero and less than one, and X3 is larger than X1.

17. The method according to claim 13, further comprising the steps of:
   forming a third barrier film on the well film, the third barrier film being made of a III-V nitride semiconductor containing nitrogen, indium and gallium, and an indium composition of the third barrier film being smaller than the indium composition of the well film;
   after forming the third barrier film, changing temperature without depositing a semiconductor film; and
   after the step of changing the temperature, forming a fourth barrier film on the third barrier film at a second temperature, the third barrier film being formed at a fourth temperature, the fourth temperature being lower than the second temperature and the fourth temperature being equal to or higher than the first temperature.

18. The method according to claim 17, wherein in the step of forming the third barrier film on the well film, at least a portion of the third barrier film is grown while changing a growth temperature.

19. The method according to claim 17, wherein the step of forming the third barrier film on the well film is carried out in a succession of the step of forming the well film on the second barrier film at the first temperature.

20. The method according to claim 17, wherein the fourth barrier film is made of an $In_{X5}Ga_{1-X5}N$ semiconductor, where X5 is not less than zero and is less than one, and
   wherein the third barrier film is made of an $In_{X4}Ga_{1-X4}N$ semiconductor, where X4 is more than zero and less than one, and where X3 is larger than X4.

21. The method according to claim 13, further comprising the steps of:
   forming a third barrier film on the well film, the third barrier film being made of a III-V nitride semiconductor containing nitrogen, indium and gallium, and an indium composition of the third barrier film being smaller than the indium composition of the well film;
   after forming the third barrier film, rising a temperature without depositing a semiconductor film; and
   forming a fourth barrier film on the third barrier film at the second temperature, the fourth barrier film being made of a III-V nitride semiconductor, at least a portion of the third barrier film being formed during the temperature rise from the first temperature to a fourth temperature, the fourth temperature being lower than the second temperature, the temperature in the step of increasing the temperature being increased from the fourth temperature to the second temperature in a predetermined period of time, and a period of time for the temperature rise from the first temperature to the fourth temperature being shorter than the predetermined period of time.

22. The method according to claim 21, wherein the predetermined period of time is not less than one minute nor more than five minutes.

23. The method according to claim 13, further comprising the steps of:
   forming a third barrier film on the well film, the third barrier film being made of a III-V nitride semiconductor containing nitrogen, indium and gallium;
   after forming the third barrier film, rising a temperature to the second temperature without depositing a semiconductor film;
   after rising the temperature to the second temperature, keeping a temperature at the second temperature in a predetermined period of time without depositing a semiconductor film; and
   forming a fourth barrier film at the second temperature, the fourth barrier film being made of a III-V nitride semiconductor, at least a portion of the third barrier film being formed in a period of time for the temperature rise from the first temperature to a fourth temperature lower than the second temperature, the temperature in the step of increasing the temperature being increased from the fourth temperature to the second temperature, and a period of time for the temperature rise from the first temperature to the fourth temperature being shorter than the predetermined period of time.

* * * * *